United States Patent
Kuroda et al.

(10) Patent No.: US 7,732,906 B2
(45) Date of Patent: Jun. 8, 2010

(54) SEMICONDUCTOR DEVICE

(75) Inventors: Hiroshi Kuroda, Akishima (JP); Nobuhiro Kinoshita, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 1112 days.

(21) Appl. No.: 11/401,283

(22) Filed: Apr. 11, 2006

(65) Prior Publication Data
US 2006/0180942 A1    Aug. 17, 2006

Related U.S. Application Data

(63) Continuation of application No. 10/737,119, filed on Dec. 17, 2003, now Pat. No. 7,504,717.

(30) Foreign Application Priority Data
Jan. 22, 2003    (JP)    ............... 2003-013953

(51) Int. Cl.
   *H01L 23/02*    (2006.01)
(52) U.S. Cl. ............... 257/686; 257/773; 257/E25.006; 257/E25.013
(58) Field of Classification Search .......... 257/685, 257/686, 723, 724, 730, 777, 778, 786, 782, 257/784, 787, 773, E25.031, E25.032, E23.042, 257/E25.066, E25.013, E25.021, E25.027, 257/E21.614
See application file for complete search history.

(56) References Cited

U.S. PATENT DOCUMENTS

| | | | |
|---|---|---|---|
| 6,410,987 B1 * | 6/2002 | Kanemoto et al. | 257/777 |
| 6,411,561 B2 | 6/2002 | Ayugawa et al. | 365/230.03 |
| 6,777,797 B2 | 8/2004 | Egawa | 257/686 |

FOREIGN PATENT DOCUMENTS

JP    2001-291821    10/2001

* cited by examiner

*Primary Examiner*—Davienne Monbleau
*Assistant Examiner*—Dilinh P Nguyen
(74) *Attorney, Agent, or Firm*—Miles & Stockbridge P.C.

(57) ABSTRACT

There is provided a small and high-performance System in Package (SiP) suitable for high-density mounting. A System in Package (SiP) has a stack structure such that two memory chips are stacked and mounted over the main surface of a wiring substrate, a microcomputer chip is stacked and mounted over the upper part thereof, and the chips are sealed by a mold resin. Each of the memory chips is constructed so as to transmit and receive data to/from the outside of the system via the microcomputer chip. The microcomputer chip is constructed of a multiport structure having various interfaces between it and the outside of the system in addition to an interface between it and the inside of the system. The number of terminals (pins) of the microcomputer chip is much larger than that of the memory chips.

5 Claims, 27 Drawing Sheets

SEMICONDUCTOR DEVICE

CROSS-REFERENCE TO RELATED APPLICATION

This application is a continuation of application Ser. No. 10/737,119 filed Dec. 17, 2003 now U.S. Pat. No. 7,504,717.

BACKGROUND OF THE INVENTION

The present invention relates to a semiconductor device and its fabricating technique. More specifically, the present invention relates to a technique effective to be applied to a System in Package; SiP) constructing a system by mounting a memory chip and a microcomputer chip over a wiring substrate.

To improve the mounting density of a semiconductor device, there are provided various stacked packages in which a plurality of semiconductor chips are mounted over a wiring substrate in three dimensions.

Patent Document 1 discloses a stacked package which permits multi functions and high-density mounting by stacking and mounting five semiconductor chips (logic chip, analog high-frequency chip, memory chip, microcomputer chip, and voltage conversion chip) over an insulating substrate. The semiconductor chip as the first layer of the five semiconductor chips stacked over the insulating substrate is connected to electrodes over the insulating substrate by the flip chip method. The semiconductor chips as the second and fourth layers are connected to electrodes over the insulating substrate by the wire bonding method, respectively. The semiconductor chips as the third and fifth layers are connected to the semiconductor chips as the lower layers (the second and fourth layers) by the flip chip method, respectively.

[Patent Document 1]
Japanese Patent Application Laid-Open No.2001-291821

SUMMARY OF THE INVENTION

Patent Document 1 discloses the technique for stacking, over an insulating substrate, a plurality of kinds of semiconductor chips including a memory chip and a microcomputer chip. Unlike the System in Package (SiP) which is being developed by the present inventors, it does not disclose any problems caused when the microcomputer chip is of multiport structure and the solving means.

An object of the present invention is to provide a technique which can realize a small and high-performance System in Package (SiP) suitable for high-density mounting.

The above and other objects and novel features of the present invention will be apparent from the description of this specification and the accompanying drawings.

A brief description of representative inventions disclosed in the present invention will be given as follows.

A semiconductor device of the present invention has a System in Package structure in which a system is constituted of a wiring substrate, and a microcomputer chip and a memory chip mounted over the upper surface of the wiring substrate, wherein the microcomputer chip is constructed of a multiport structure having an interface between it and the inside of the system including the memory chip and an interface between it and the outside of the system, respectively, wherein the memory chip is constructed so as to be accessed to the outside of the system via the microcomputer chip, and wherein the microcomputer chip is mounted over the wiring substrate in a state being stacked over the memory chip.

In addition, a semiconductor device of the present invention has a System in Package structure in which a system is constituted of a wiring substrate, and one microcomputer chip and two memory chips mounted over the upper surface of the wiring substrate, wherein the microcomputer chip is constructed of a multiport structure having an interface between it and the inside of the system including the two memory chips and an interface between it and the outside of the system, respectively, wherein each of the two memory chips is constructed so as to be accessed to the outside of the system via the microcomputer chip, and wherein the two memory chips are mounted over the wiring substrate in a state that one of them is stacked over the other and the microcomputer chip is mounted over the wiring substrate in a state being stacked over the two memory chips.

DESCRIPTION OF THE PREFERRED EMBODIMENTS

Figure 1:
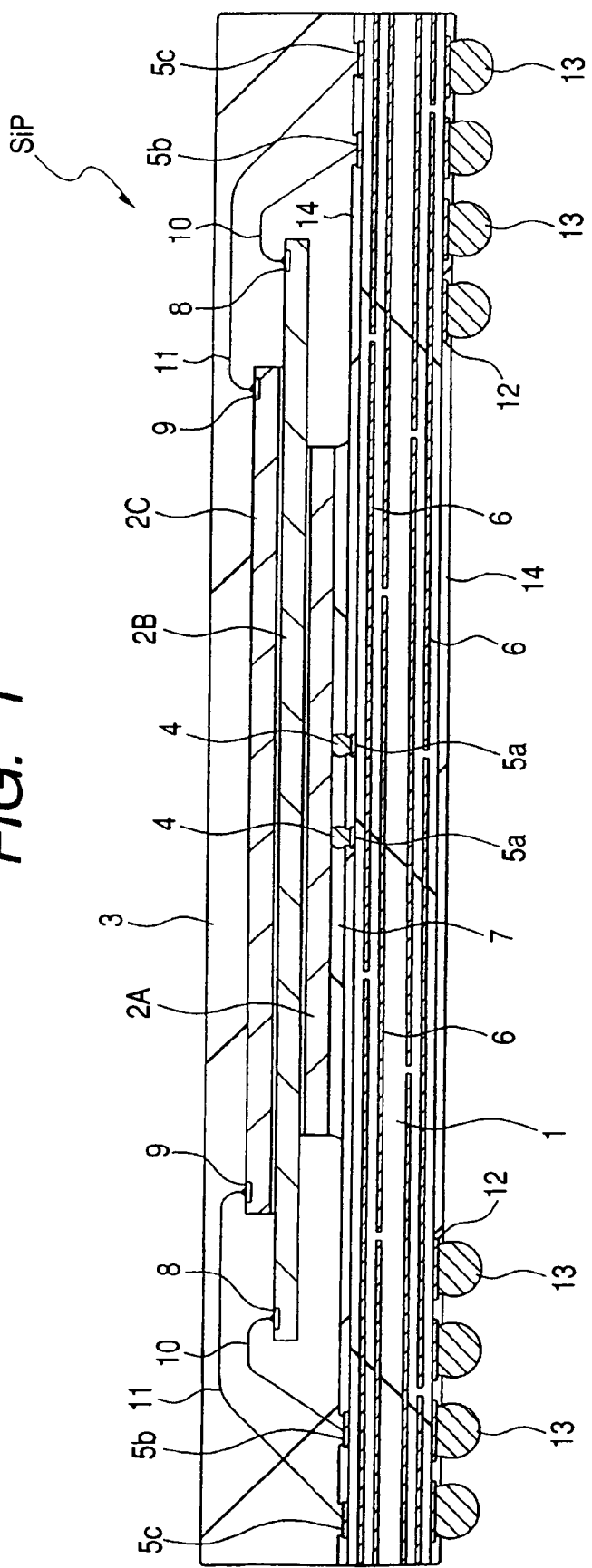
FIG. 1 is a cross-sectional view showing a semiconductor device of an embodiment of the present invention.

Embodiments of the present invention will be described below in detail based on the drawings. Like members of all the drawings of assistance in explaining the embodiments are indicated by the same reference numerals, and the repeated description is omitted.

Embodiment 1

Figure 2:
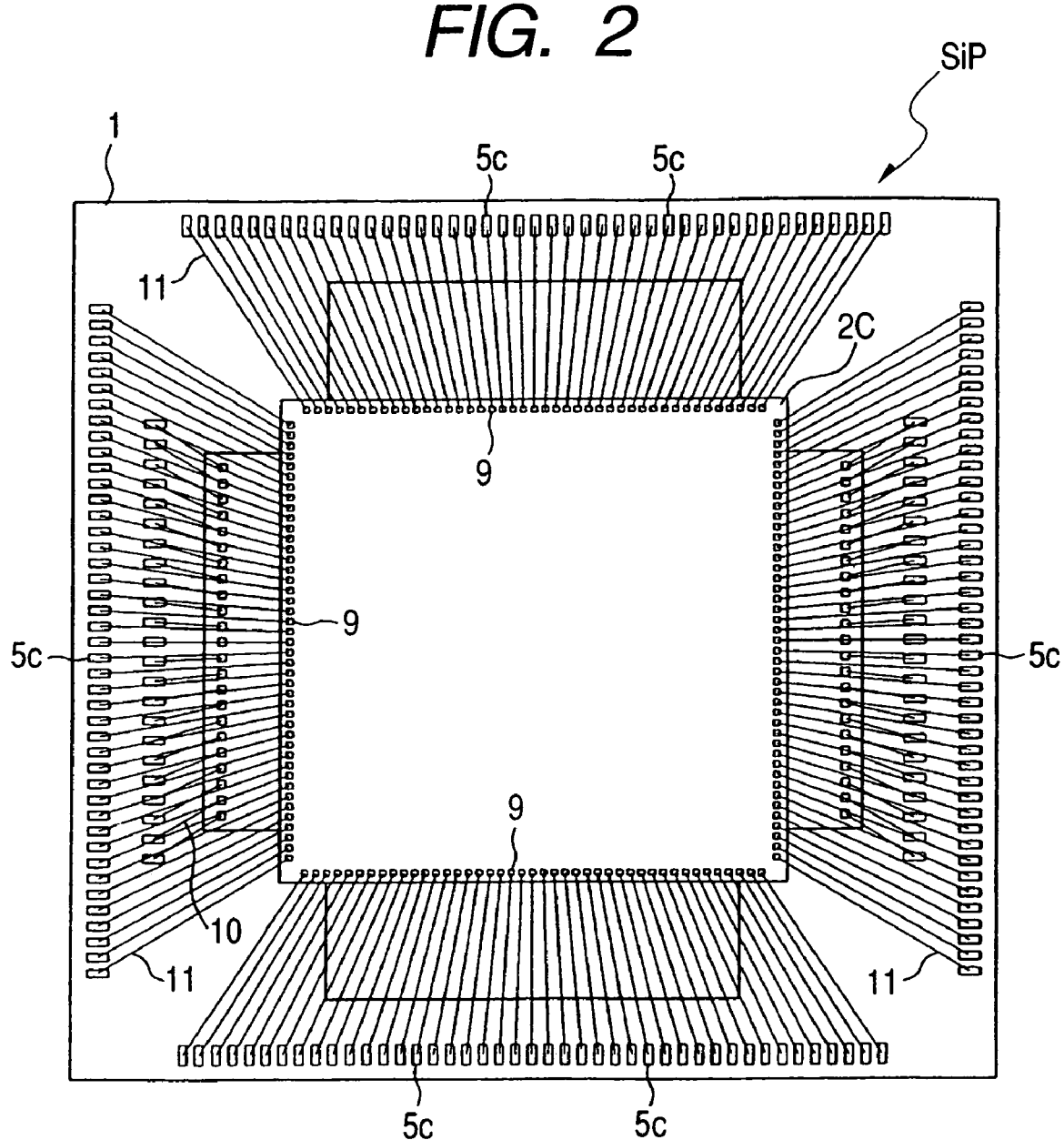
FIG. 2 is a plan view showing the inner structure of a semiconductor device of an embodiment of the present invention.
Figure 3:
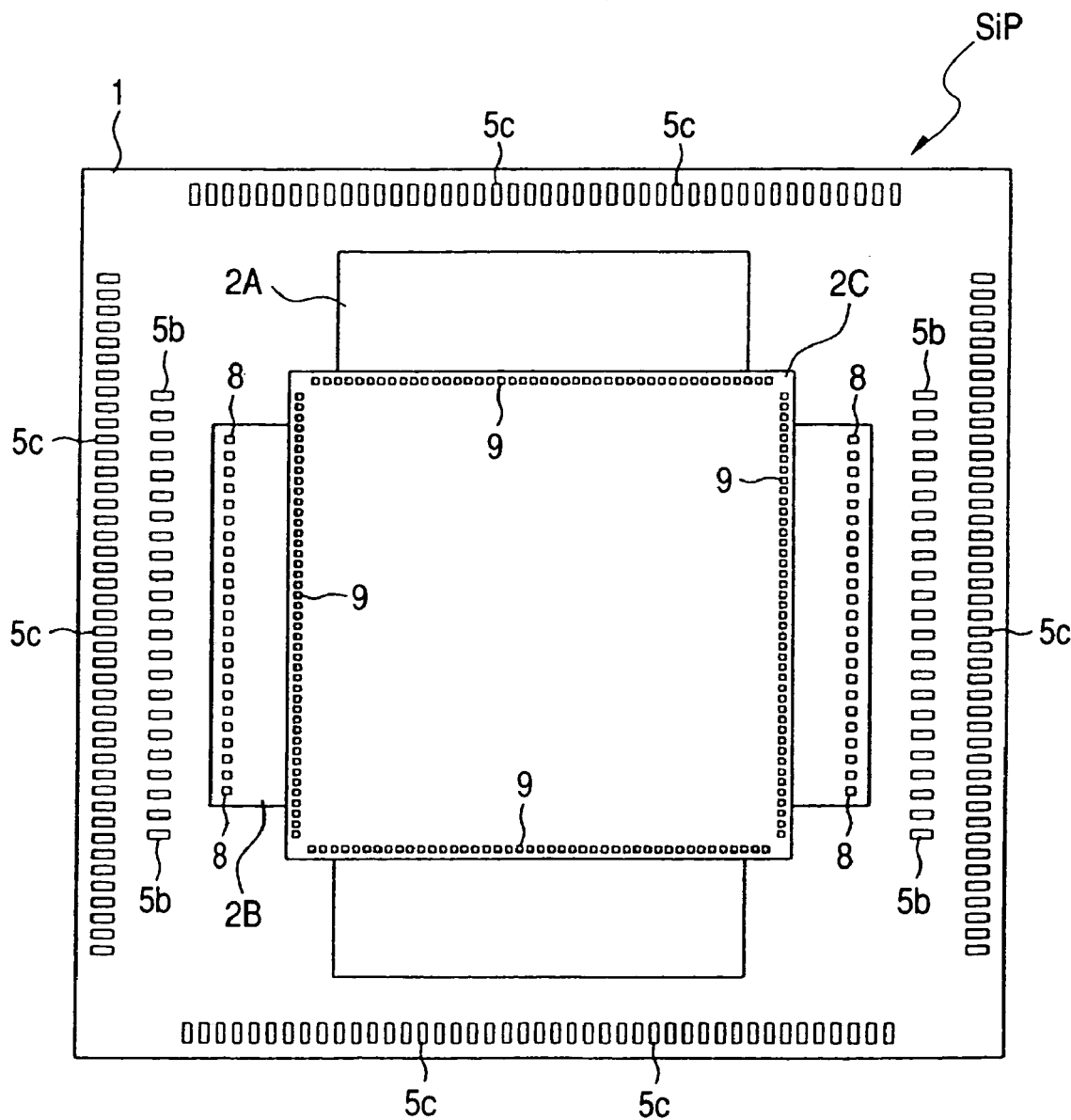
FIG. 3 is a plan view showing a layout of semiconductor chips mounted over a wiring substrate of a semiconductor device of an embodiment of the present invention.
Figure 4:
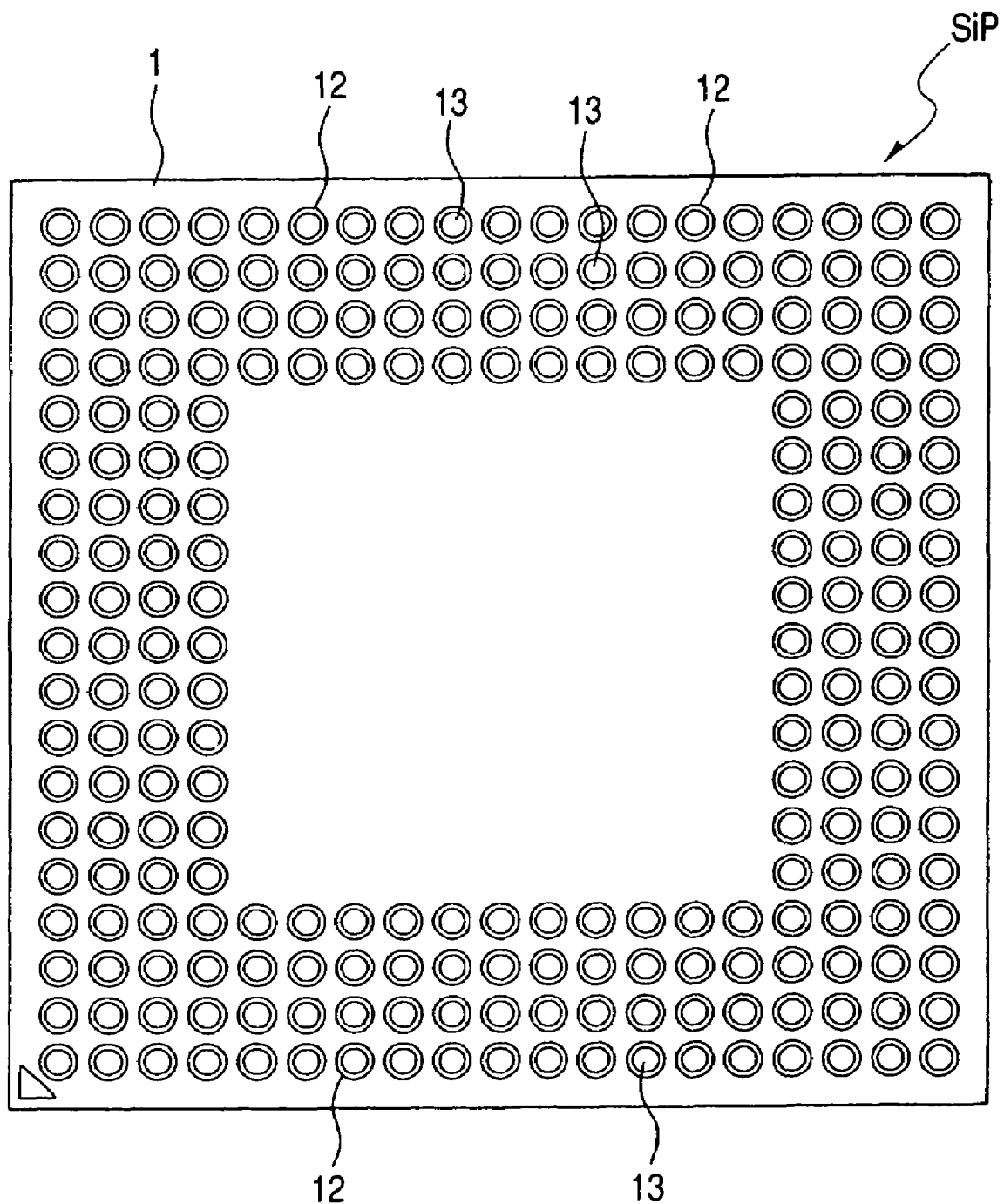
FIG. 4 is a plan view showing the lower surface of a wiring substrate of a semiconductor device of an embodiment of the present invention.

FIG. 1 is a cross-sectional view showing a semiconductor device of this embodiment. FIG. 2 is a plan view showing the inner structure of the semiconductor device. FIG. 3 is a plan view showing a layout of semiconductor chips mounted over a wiring substrate of the semiconductor device. FIG. 4 is a plan view showing the lower surface of the wiring substrate of the semiconductor device.

The semiconductor device of this embodiment is a System in Package (SiP) having a stack structure such that three silicon chips (memory chips 2A, 2B and a microcomputer chip 2C) are stacked in three stages and mounted over the main surface of a wiring substrate 1 to seal the silicon chips (the memory chips 2A, 2B and the microcomputer chip 2C) by a mold resin 3.

The memory chip 2A in the lower stage of the silicon chips (the memory chips 2A, 2B and the microcomputer chip 2C) stacked in three stages is formed with a 64-Mbit DRAM. The memory chip 2A has a rectangular planar shape and is connected to electrodes 5a of the wiring substrate 1 via a plurality of Au bumps 4 formed over its main surface (lower surface). An under fill resin 7 is filled in the gap between the main surface (lower surface) of the memory chip 2A and the wiring substrate 1. The memory chip 2A formed with the DRAM is mounted over the wiring substrate 1 by the-flip chip method.

The memory chip 2B in the middle stage stacked over the memory chip 2A is formed with a 16-Mbit flash memory. The memory chip 2B has a rectangular planar shape. A plurality of bonding pads 8 formed along two short sides of its main surface (upper surface) are connected to electrodes 5b of the wiring substrate 1 via Au wires 10, respectively. The memory chip 2B is arranged in the direction so that its long side crosses the long side of the memory chip 2A in the lower stage and is fixed over the upper surface of the memory chip 2A with an adhesive. The memory chip 2B formed with the flash memory is stacked over the memory chip 2A and is connected to the wiring substrate 1 by the wire bonding method.

The microcomputer chip 2C in the upper stage stacked over the memory chip 2B is formed with a high-speed microprocessor (MPU: microprocessing unit) having an operating frequency of 133 MHz. The microcomputer chip 2C has a square planar shape. A plurality of bonding pads 9 formed along four sides of its main surface (upper surface) are connected to electrodes 5c of the wiring substrate 1 via Au wires 11, respectively. The microcomputer chip 2C is arranged in the center part of the chip 2B as the lower layer and is fixed over the upper surface of the memory chip 2B with an adhesive.

The length of one side of the microcomputer chip 2C is shorter than the long side of the memory chip 2B as the lower layer. When the microcomputer chip 2C is superposed over the memory chip 2B, the bonding pads 8 formed near the short sides of the memory chip 2B are not superposed over the microcomputer chip 2C. The microcomputer chip 2C formed with the MPU is stacked over the memory chip 2B and is connected to the wiring substrate 1 via the wire bonding method.

The wiring substrate 1 over which the three silicon chips (2A, 2B and 2C) are mounted constructs a relay substrate (interposer) when the silicon chips (2A, 2B and 2C) are mounted over the mother board of various kinds of portable equipment. The dimensions of the wiring substrate 1 are 13 mm×13 mm.

The wiring substrate 1 is a multilayered wiring substrate composed mainly of a general-purpose resin such as an epoxy resin including glass fiber (glass-fabric-based epoxy resin). Its upper surface and inside are formed with wires 6 of about 4 to 6 layers connected to any one of the electrodes 5a, 5b and 5c. The lower surface of the wiring substrate 1 is formed with 240 electrodes 12 connected to any one of the wires 6. The electrodes 12 are connected to solder bumps 13, respectively. The electrodes 5a, 5b and 5c, the wires 6, and the electrodes 12 are made of Cu. Plating of Sn is applied to the surfaces of the electrodes 5a, 5b, 5c and 12. Solder resists 14 made of an epoxy resin or an acryl resin are coated over the upper and lower surfaces of the wiring substrate 1 except for the surfaces of the electrodes 5a, 5b, 5c and 12.

The solder bumps 13 connected to the electrodes 12 of the lower surface of the wiring substrate 1 construct external connection terminals of the System in Package (SiP). The System in Package (SiP) is mounted over the mother board of various kinds of portable equipment via the solder bumps 13.

The System in Package (SiP) of this embodiment is constructed of a BGA (Ball Grid Array) structure having 240 pins such that three silicon chips (two memory chips and one microcomputer chip) are stacked in three stages and mounted over the wiring substrate 1 to construct the system by the three silicon chips.

When the microcomputer chip 2C has the following multi functions in the System in Package (SiP) in which the memory chips 2A, 2B and the microcomputer chip 2C are stacked and mounted, the number of pins of the microcomputer chip 2C is much larger than that of the memory chips 2A, 2B. The microcomputer chip 2C is stacked in the upper stage of the memory chips 2A, 2B, resulting in an effect specific for the structure.

Figure 5:
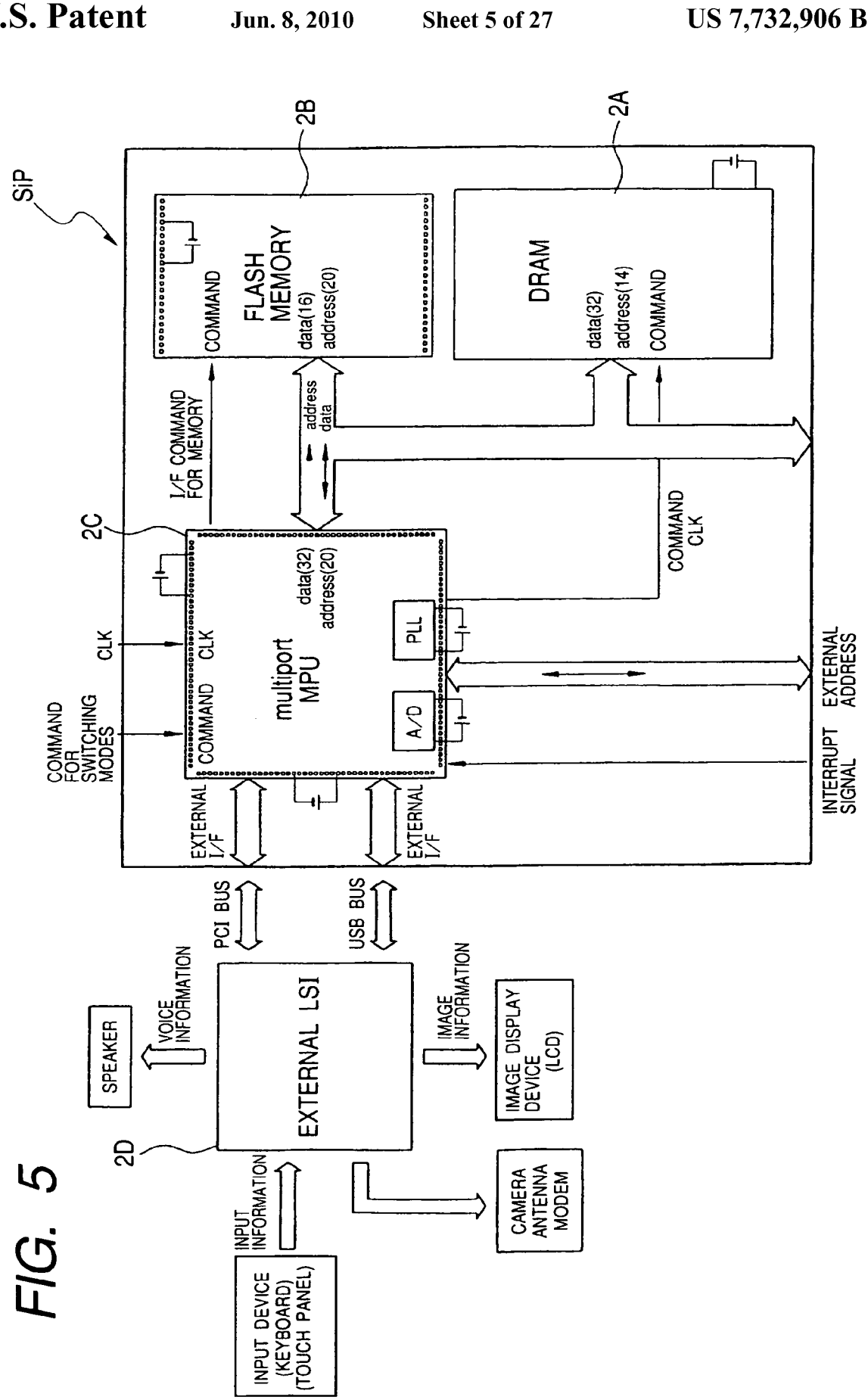
FIG. 5 is a block diagram schematically showing a system configuration of a semiconductor device of an embodiment of the present invention.

The functions of the microcomputer chip 2C and the memory chips 2A, 2B and pin constructions with it will be described using FIG. 5. Along with the embodiment, the case of having, as the memory chips, the memory chip 2A formed with the DRAM and the memory chip 2B formed with the flash memory will be described here. The number and kind of the memory chips are not limited to this example.

As one of main roles of the microcomputer chip, in order to input and output data by interfacing between an external LSI (2D) provided in the outside of the system and the memory chips 2A, 2B provided in the inside of the system, there is an operation so that a logic address for an external interface (external address) is converted to a physical address of the flash memory or the DRAM.

When the microcomputer chip 2C plays such role, the microcomputer chip 2C requires pins constructing the external interface other than the number of pins necessary for interfaces between the microcomputer chip 2C and the memory chips 2A, 2B. The number of pins of the microcomputer chip 2C is larger than that of the memory chips 2A, 2B by the number of pins necessary for the external interface.

Data outputted via the external interface is converted to various kinds of information via the external LSI (2D) and is then outputted to human interface equipment or network equipment transmitting and receiving information to/from human. For example, voice information is outputted as voice via a speaker, and image information is outputted as an image via an image display device such as a liquid crystal display (LCD). Information inputted from the human interface equipment or the network equipment may be inputted to the external interface of the microcomputer chip 2C via the external LSI (2D).

The microcomputer chip 2C of this embodiment has, as the external interface, a PCI bus and a USB bus. When the microcomputer chip 2C has a plurality of kinds of external interfaces, the number of pins necessary for the microcomputer chip 2C is larger than that of one kind of external interface of the microcomputer chip 2C.

When there are a plurality of kinds of memory chips such as the flash memory chip (2B) and the DRAM chip (2A), the number of pins necessary for the memory interface of the microcomputer chip 2C is larger than the number of pins owned by the interfaces of the respective memory chips. In this embodiment, the flash memory chip (2B) has, as the interface construction, 20 address pins and 16 data pins and further has a command pin. The DRAM chip (2A) has, as the interface construction, 14 address pins and 32 data pins and further has a command pin.

When the pin constructions constructing the respective interfaces of the memory chips 2A, 2B are different, the microcomputer chip 2C must have the number of pins which can correspond to the interface construction having the largest number of pins. In this embodiment, the microcomputer chip 2C has, as the memory interfaces, 20 address pins and 32 data pins and by itself has pins connected to the respective command pins of the memory chips 2A, 2B. When having, as the memory chips, a plurality of kinds of memories, the number of pins of the memory interface construction of the microcomputer chip 2C may be larger than that of the interfaces owned by the respective memory chips 2A, 2B.

The microcomputer chip may have various circuits other than the MPU. In this case, it requires the larger number of pins to supply a power source stable for each of the circuits. For example, the microcomputer chip 2C of this embodiment has an A/D conversion circuit and a PLL circuit. The A/D conversion circuit and the PLL circuit can be a power noise source in itself and has a characteristic weak against power noise from outside. They have power supply pins separated from the MPU, which can increase the number of pins of the microcomputer chip 2C. The microcomputer chip 2C also has an external interface circuit. To realize stable signal amplification in the external interface circuit, it requires power supply pins independently of the inner circuit such as the MPU, which can increase the number of pins of the microcomputer chip 2C.

Figure 6:
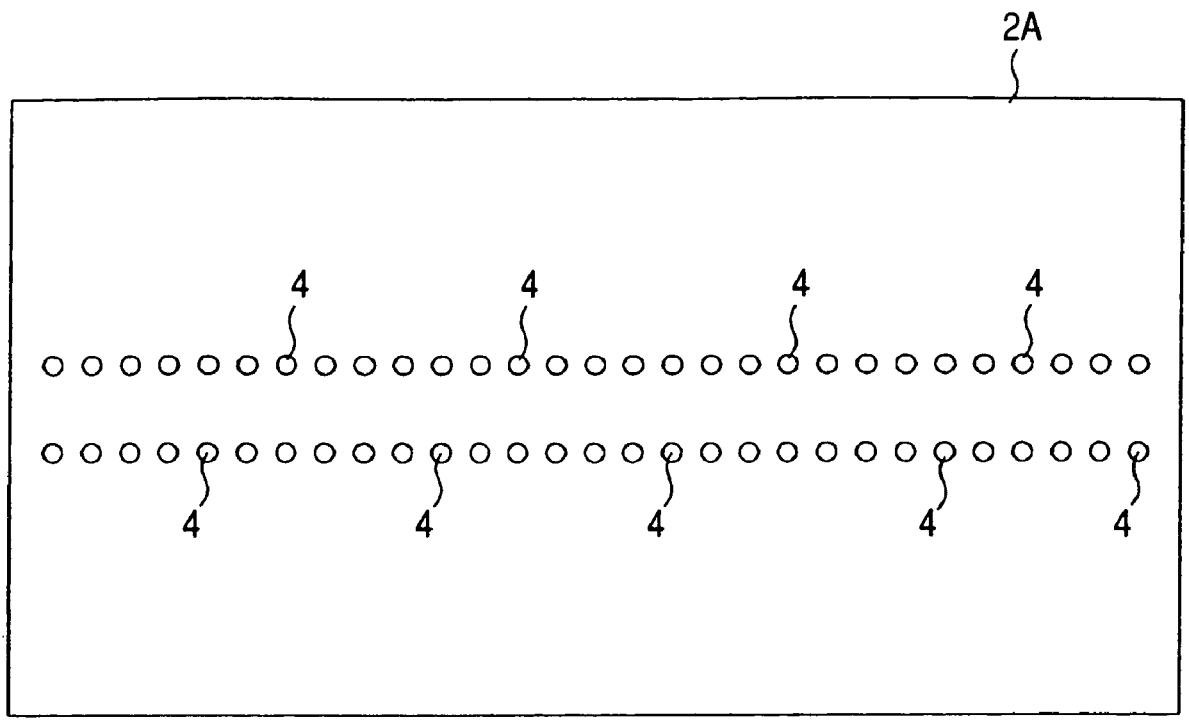
FIG. 6 is a plan view showing a layout of Au bumps formed over a main surface of a memory chip.
Figure 7:
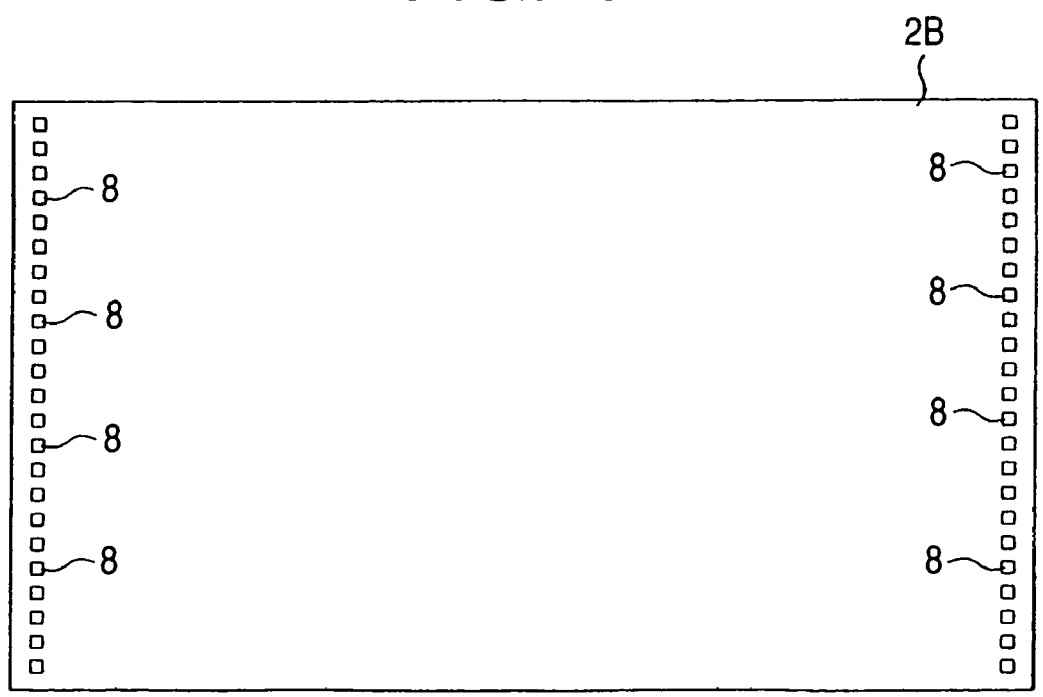
FIG. 7 is a plan view showing a layout of bonding pads formed over the main surface of a memory chip.

FIG. 6 is a plan view showing a layout of the Au bumps 4 formed over the main surface of the memory chip 2A. FIG. 7 is a plan view showing a layout of the bonding pads 8 formed over the main surface of the memory chip 2B. In this embodiment, two rows of the Au bumps 4 of the memory chip 2A formed with the DRAM are arranged in the center of its main surface. The bonding pads 8 of the memory chip 2B formed with the flash memory are arranged along two short sides of its main surface.

Figure 8:
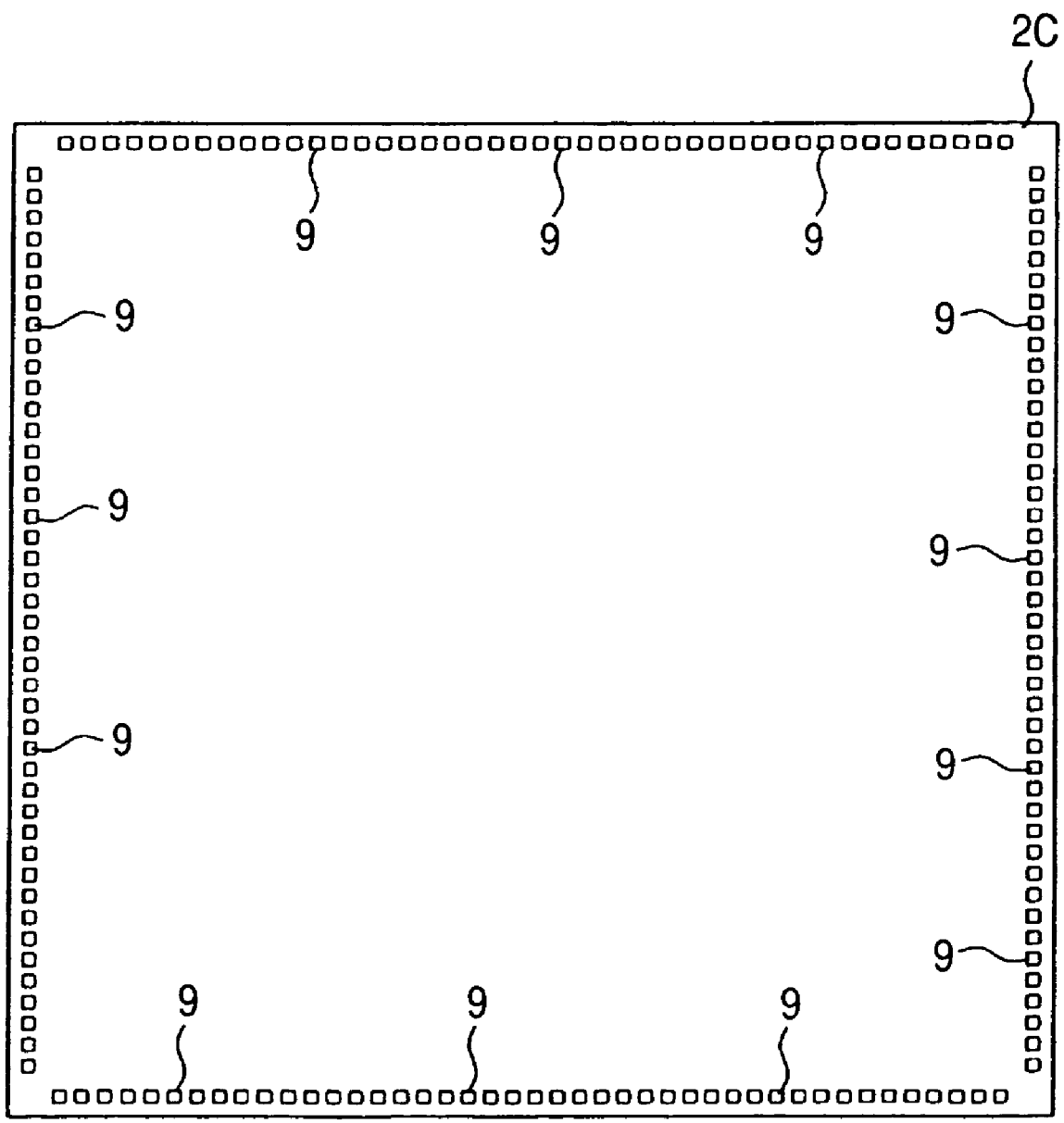
FIG. 8 is a plan view showing a layout of bonding pads formed over the main surface of a microcomputer chip.

The microcomputer chip 2C is constructed of a multiport structure having various interfaces between it and the outside of the system in addition to an interface between it and the inside of the system (the memory chips 2A, 2B). The number of terminals (pins) of the microcomputer chip 2C is much larger than that of the memory chips 2A, 2B (e.g., 240 pins). As shown in FIG. 8, the bonding pads 9 of the microcomputer chip 2C are arranged along four sides of its main surface.

Figure 9:
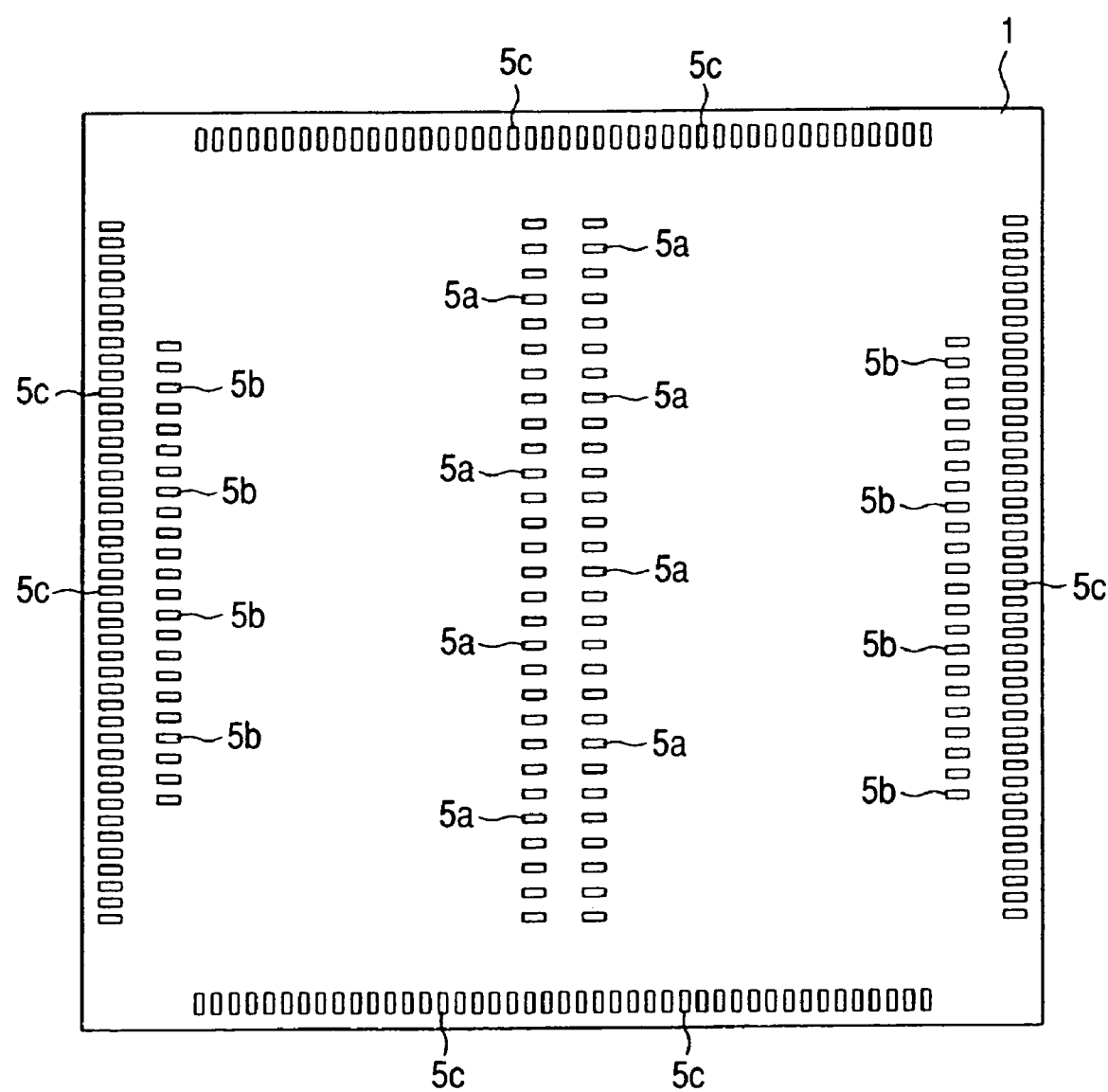
FIG. 9 is a plan view showing a layout of electrodes formed over the main surface of a wiring substrate.

When the microcomputer chip 2C having a large number of pins is mounted over the wiring substrate 1, the number of the electrodes 5c of the wiring substrate 1 connected to the microcomputer chip 2C is larger than that of the electrodes 5a connected to the memory chip 2A and that of the electrodes 5b connected to the memory chip 2B. To secure the pitch of the electrodes 5c, the electrodes 5c must be arranged in positions away from the center of the wiring substrate 1. To promote high-density mounting of the System in Package (SiP), the outer dimensions of the wiring substrate 1 must be minimized. As shown in FIG. 9, the electrodes 5c connected to the microcomputer chip 2C are arranged in the outermost periphery part of the wiring substrate 1. The electrodes 5a connected to the memory chip 2A and the electrodes 5b connected to the memory chip 2B are arranged in the inside thereof.

When the microcomputer chip 2C having a large number of pins and the memory chips 2A, 2B having a small number of pins are stacked and mounted over the wiring substrate 1, the microcomputer chip 2C must be arranged in the upper stage of the memory chips 2A, 2B. The reason is as follows. When the memory chip 2B is arranged in the upper stage of the microcomputer chip 2C, the Au wires 11 connecting the microcomputer chip 2C and the electrodes 5c crosses the Au wires 10 connecting the memory chip 2B and the electrodes 5b so that both can be contacted with each other.

Two rows of the bonding pads, not shown, are arranged in the center of the main surface of the memory chip 2A of this embodiment. Instead of use of the wire bonding method, it is advantageous that the Au bumps 4 are connected to these bonding pads to be connected to the electrodes 5a by the flip chip method.

From such reason, in the System in Package (SiP) of this embodiment, the memory chip 2B is stacked over the memory chip 2A, and further the memory chip 2C is stacked over the memory chip 2B. This can realize the small and high-performance System in Package (SiP) suitable for high-density mounting. In addition, the microcomputer chip 2C which is operated faster than the memory chips 2A, 2B and has a heat generation amount larger than that of the memory chips 2A, 2B is arranged in the uppermost stage, thereby improving heat release. The System in Package (SiP) having high reliability can thus be realized.

As opposed to the above example, when the bonding pads are arranged along two short sides of the memory chip 2A formed with the DRAM and the bonding pads are arranged in the center of the memory chip 2B formed with the flash memory, the memory chip 2B is arranged in the lowermost stage to be connected to the electrodes 5b by the flip chip method, and the memory chip 2A is stacked thereover to be connected to the electrodes 5a by the wire bonding method. Also in this case, from the above reason, the microcomputer chip 2C having a large number of pins is arranged in the uppermost stage.

When the bonding pads are arranged in the periphery part of the main surfaces of both of the memory chips 2A, 2B, the memory chip 2A and the electrodes 5a, and the memory chip 2B and the electrodes 5b may be connected by the wire bonding method, respectively. In this case, the stacking order of the memory chips 2A, 2B is decided in consideration of operability of the wire bonding. In either case, from the above reason, the microcomputer chip 2C having a large number of pins is arranged in the uppermost stage.

A method for fabricating the semiconductor device of this embodiment constructed as described above will be described using FIGS. 10 to 19.

Figure 10:
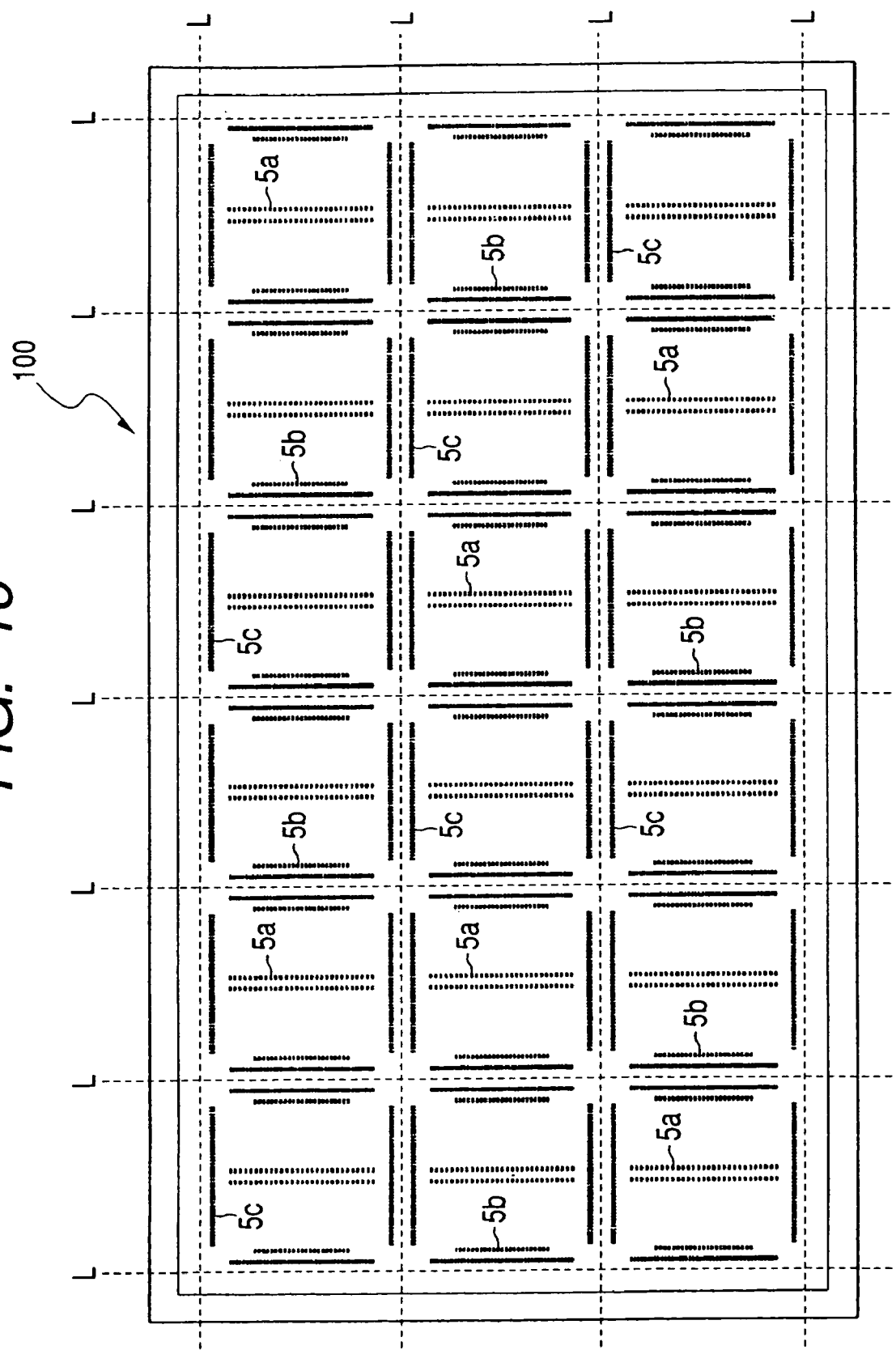
FIG. 10 is a plan view showing the main surface of a multi wiring substrate used for fabricating a semiconductor device of an embodiment of the present invention.
Figure 11:
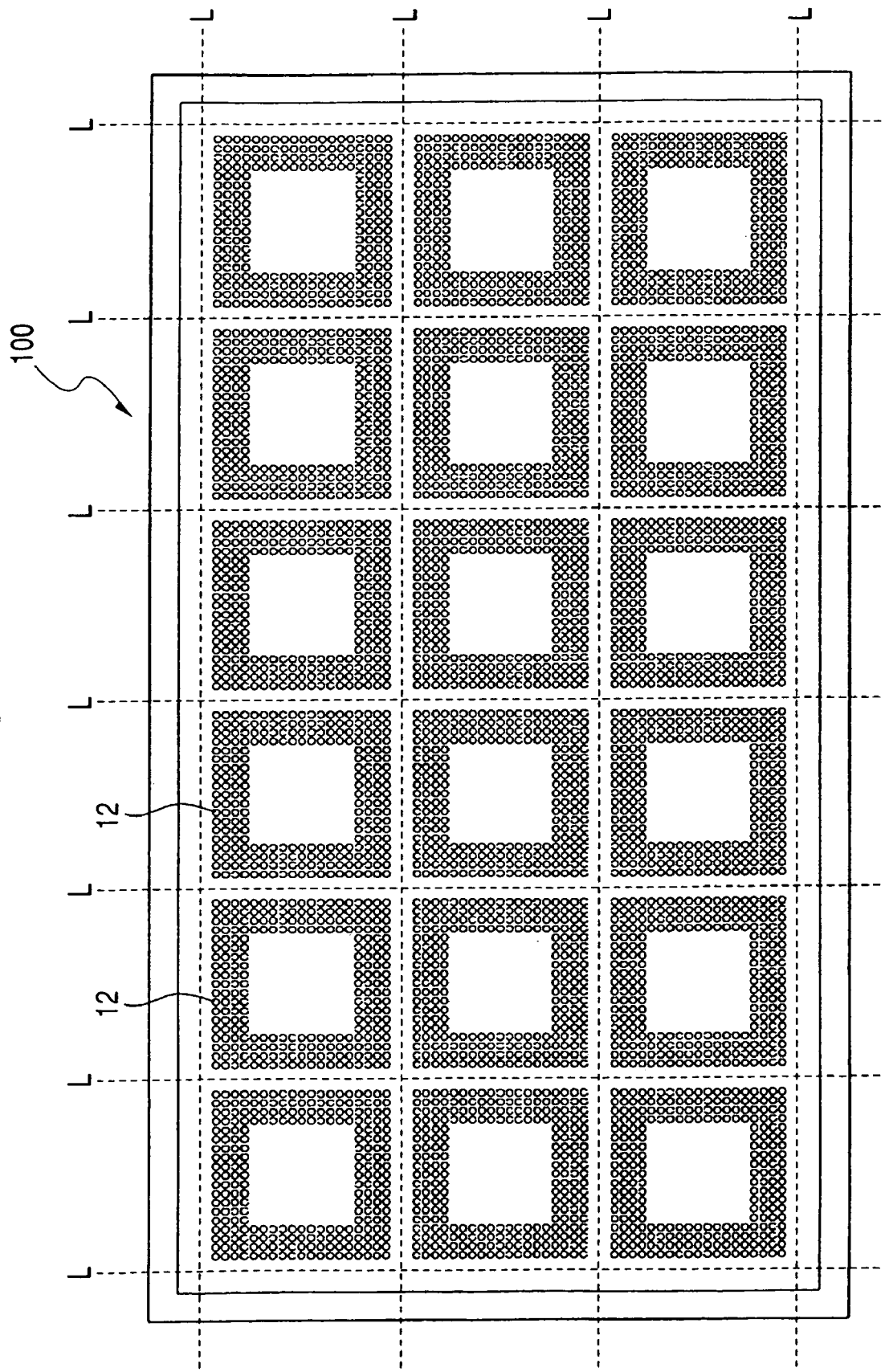
FIG. 11 is a plan view showing the rear surface of a multi wiring substrate used for fabricating a semiconductor device of an embodiment of the present invention.

FIG. 10 is a plan view showing the main surface (chip mounted surface) of a multi wiring substrate 100 used for fabricating the System in Package (SiP). FIG. 11 is a plan view showing the rear surface of the multi wiring substrate 100.

The multi wiring substrate 100 is a substrate which is a base material of the wiring substrate 1. The multi wiring substrate 100 is cut (diced) into grids along dicing lines L shown in FIGS. 10 and 11 to obtain a plurality of the wiring substrates 1. For example, in the multi wiring substrate 100 shown in the drawing, its long side direction is sectioned into wiring substrate areas of six blocks and its short side direction is sectioned into wiring substrate areas of three blocks to obtain the wiring substrates 1 of 3×6=18. The multi wiring substrate 100 is a multilayered wiring substrate composed mainly of a general-purpose resin such as a glass-fabric-based epoxy resin. Its main surface is formed with the electrodes 5a, 5b and 5c and wires, not shown. Its rear surface is formed with the electrodes 12. The electrodes 5a, 5b, 5c and 12 and wires are formed by etching a Cu foil adhered over the surface of the resin.

To fabricate the System in Package (SuP), the multi wiring substrate 100 and the silicon chips (the memory chips 2A, 2B and the microcomputer chip 2C) shown in FIGS. 6 to 8 are prepared. The bonding pads of the memory chip 2A formed with the DRAM are connected to the Au bumps 4 using ball bonding equipment.

Figure 12:
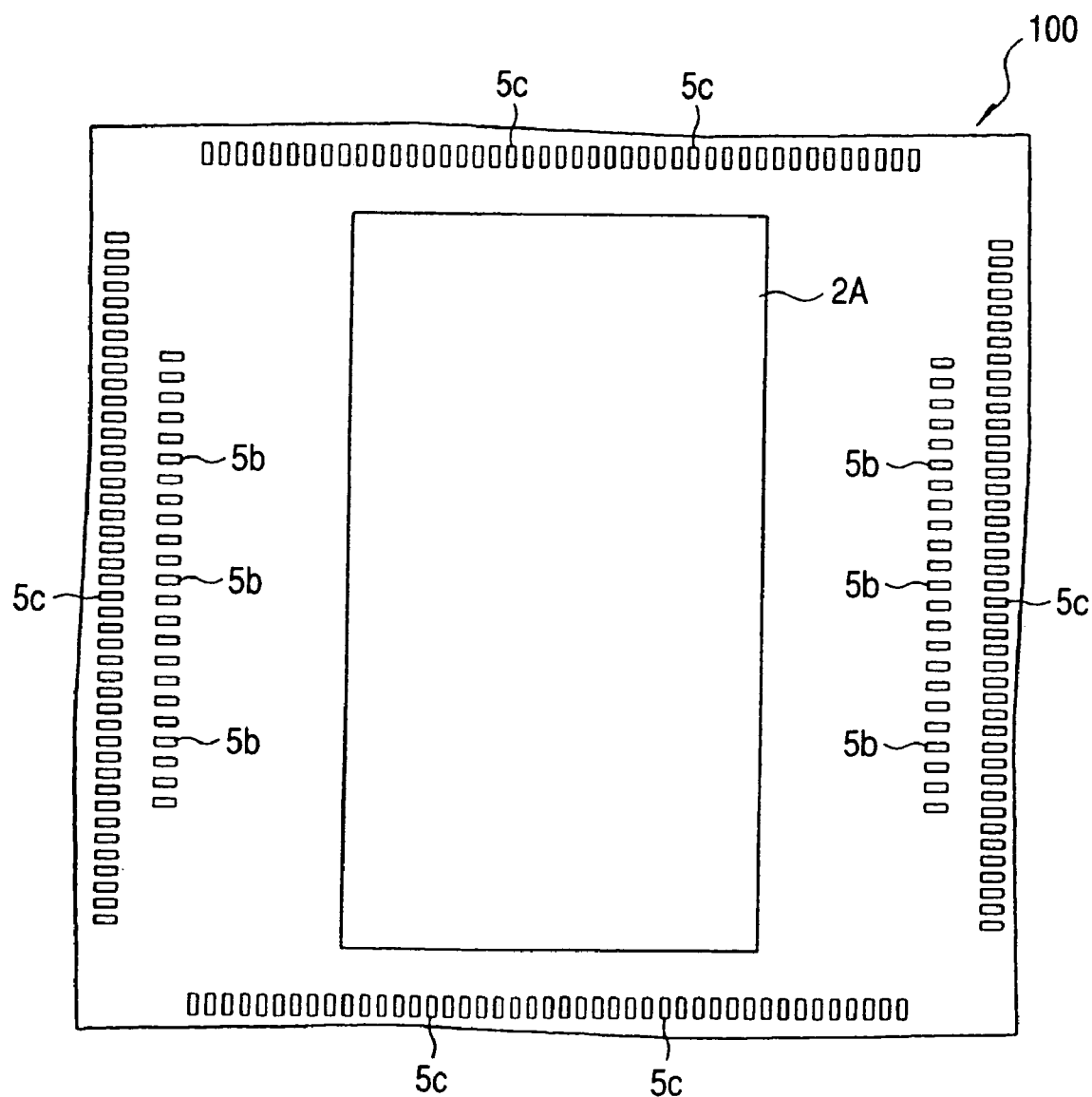
FIG. 12 is a plan view of an essential part of a multi wiring substrate showing a semiconductor device fabrication method of an embodiment of the present invention.
Figure 13:
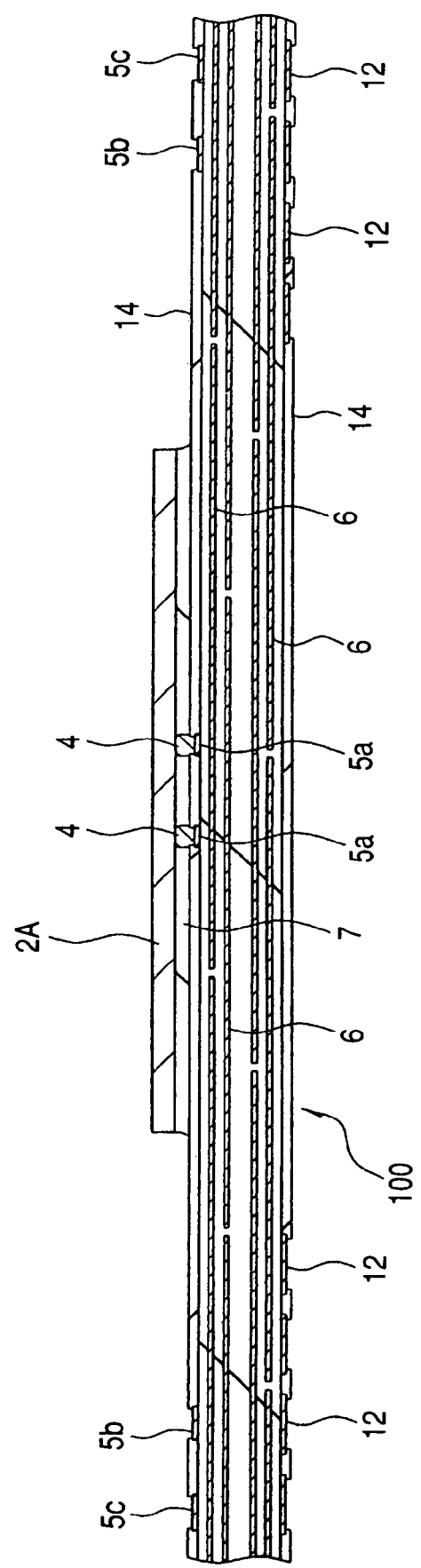
FIG. 13 is a cross-sectional view of an essential part of a multi wiring substrate showing a semiconductor device fabrication method of an embodiment of the present invention.

As shown in FIGS. 12 and 13, the memory chip 2A is mounted in each of the wiring substrate areas of the main surface of the multi wiring substrate 100 by the flip chip method. After connecting the Au bumps 4 of the memory chip 2A and the electrodes 5a of the multi wiring substrate 100, the under fill resin 7 is filled in the gap between the memory chip 2A and the multi wiring substrate 100. Connection of the Au bumps 4 and the electrodes 5a can also be done by interposing a tape or paste made of an anisotropic conductive resin or a non conductive resin in the gap between the memory chip 2A and the multi wiring substrate 100 to heat and melt the tape or paste. In this case, the step for filling the under fill resin 7 is unnecessary.

Figure 14:
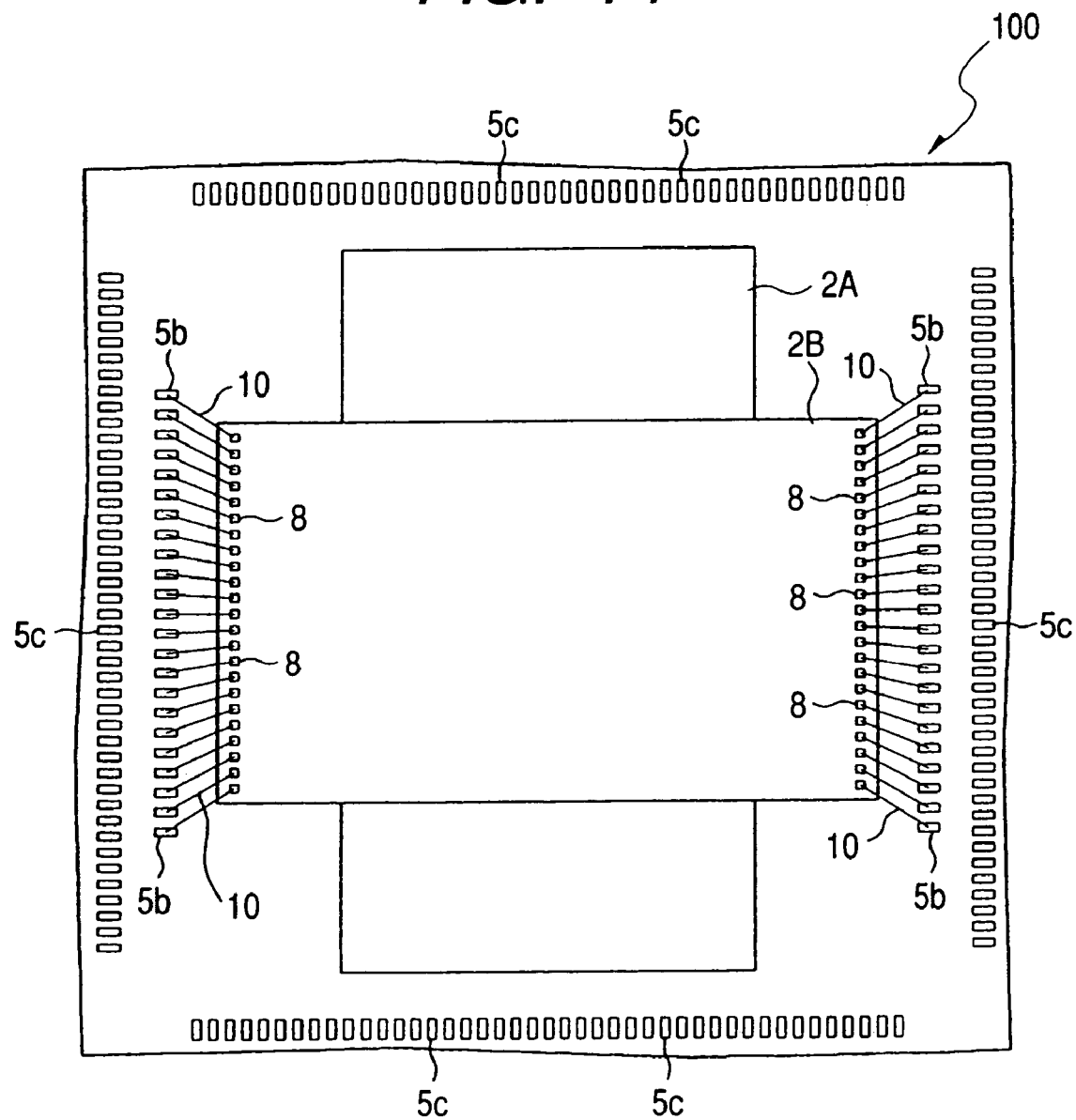
FIG. 14 is a plan view of an essential part of a multi wiring substrate showing a semiconductor device fabrication method of an embodiment of the present invention.
Figure 15:
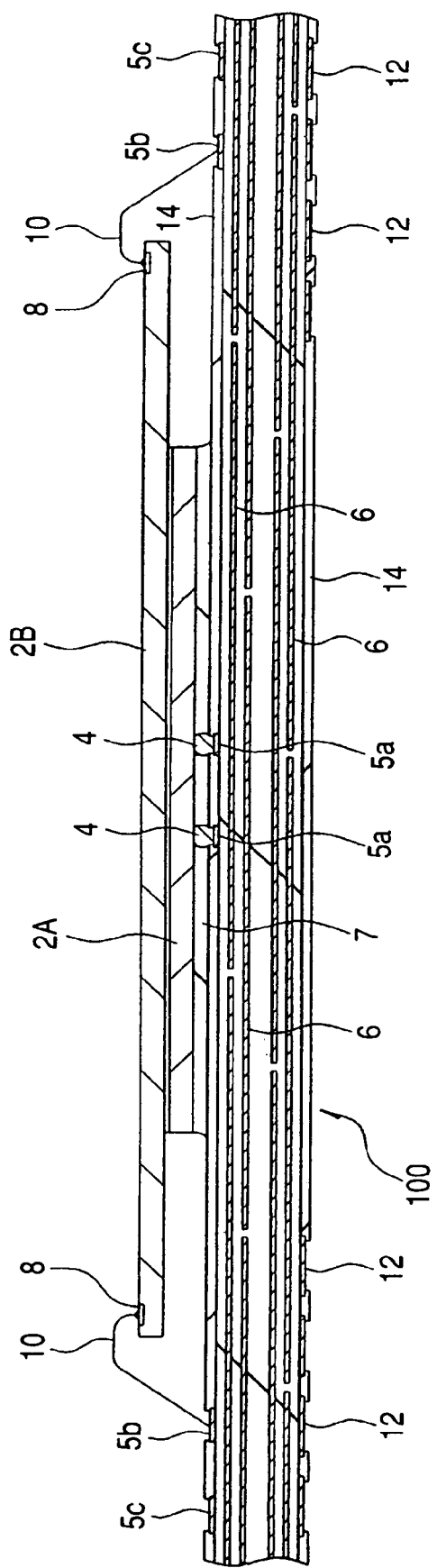
FIG. 15 is a cross-sectional view of an essential part of a multi wiring substrate showing a semiconductor device fabrication method of an embodiment of the present invention.

As shown in FIGS. 14 and 15, after fixing the memory chip 2B over the upper surface of the memory chip 2A using an adhesive, the bonding pads 8 of the memory chip 2B and the electrodes 5b of the multi wiring substrate 100 are connected by the Au wires 10. The bonding of the Au wires 10 is performed using a wire bonder using ultrasonic oscillation and thermocompression together.

Figure 16:
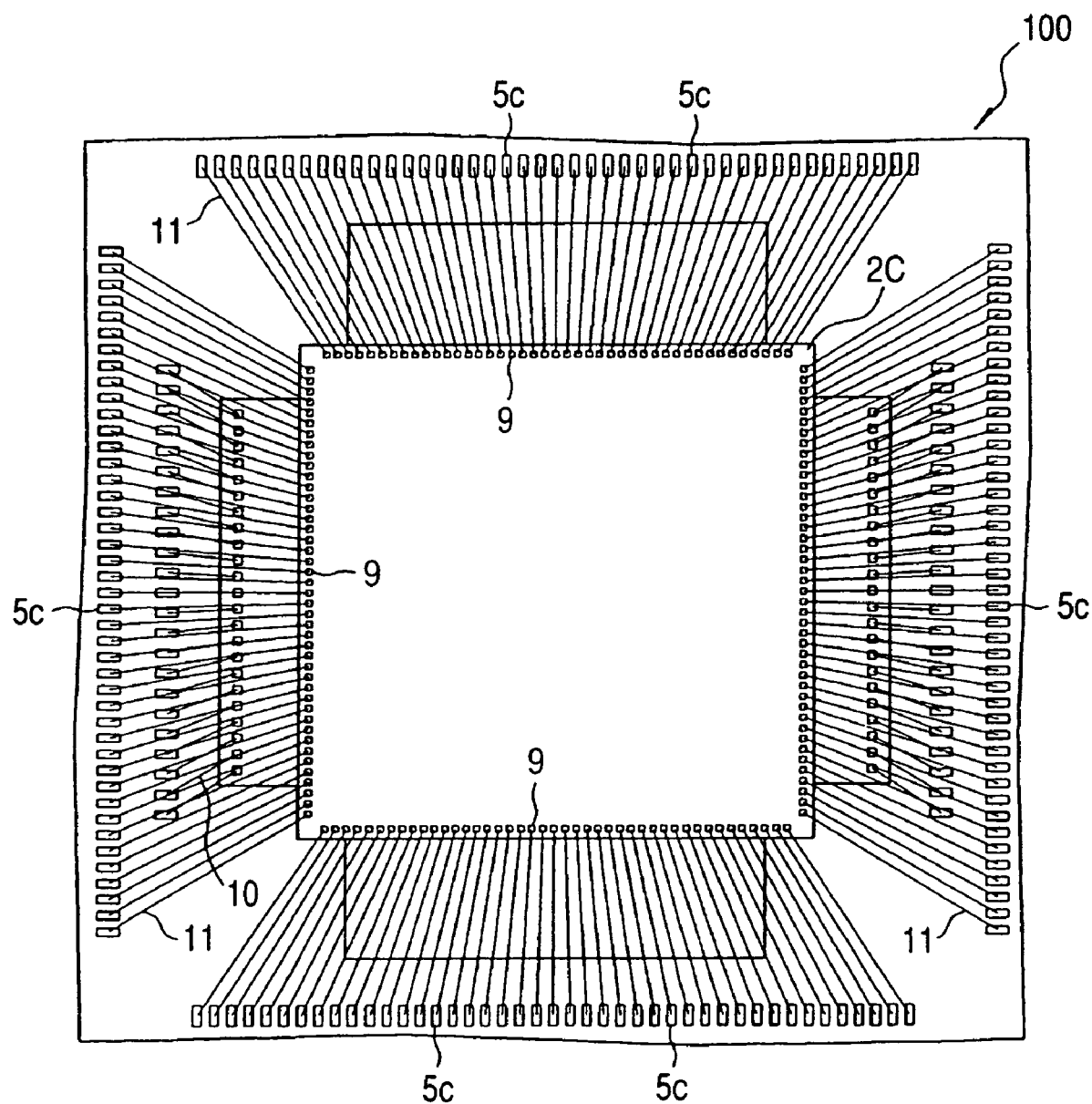
FIG. 16 is a plan view of an essential part of a multi wiring substrate showing a semiconductor device fabrication method of an embodiment of the present invention.
Figure 17:
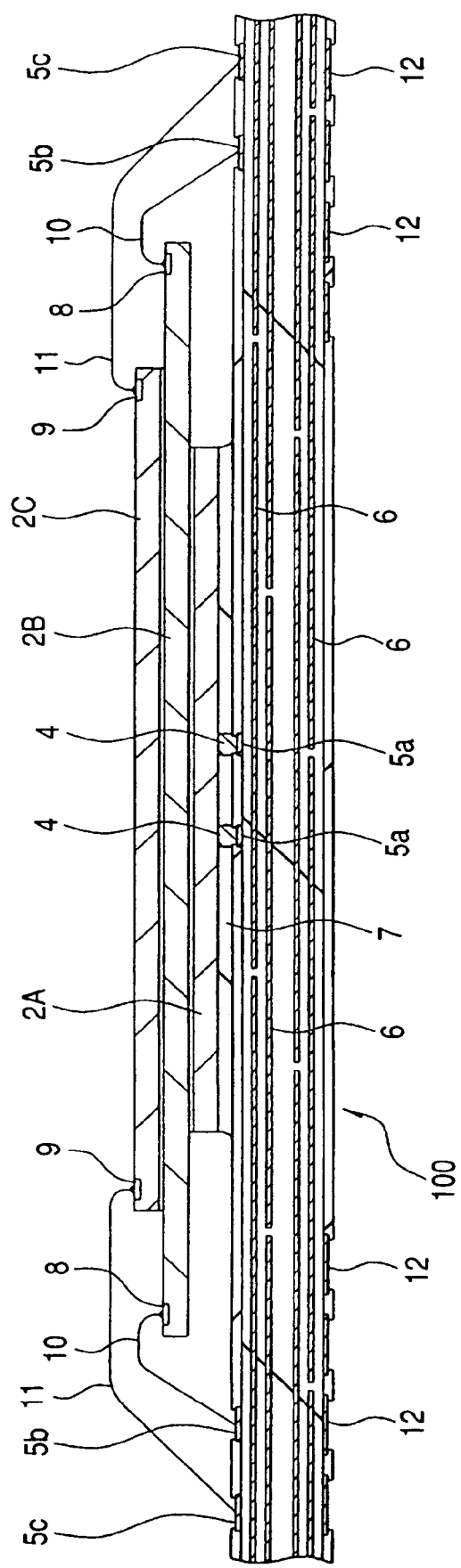
FIG. 17 is a cross-sectional view of an essential part of a multi wiring substrate showing a semiconductor device fabrication method of an embodiment of the present invention.

As shown in FIGS. 16 and 17, after fixing the microcomputer chip 2C over the upper surface of the memory chip 2B using an adhesive, the bonding pads 9 of the microcomputer chip 2C and the electrodes 5c of the multi wiring substrate 100 are connected by the Au wires 11. The bonding of the Au wires 11 is performed using a wire bonder using ultrasonic oscillation and thermocompression together, as in the bonding of the Au wires 10.

Figure 18:
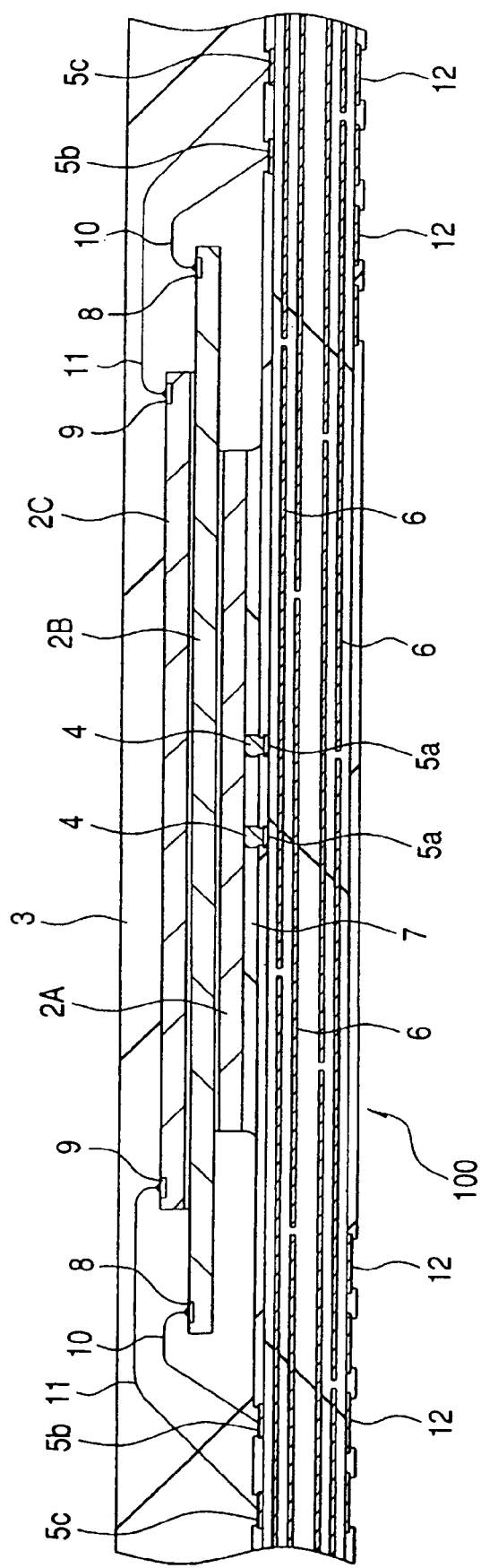
FIG. 18 is a cross-sectional view of an essential part of a multi wiring substrate showing a semiconductor device fabrication method of an embodiment of the present invention.

As shown in FIG. 18, the multi wiring substrate 100 is fitted into a mold, not shown, to seal the entire main surface thereof by the mold resin 3. The mold resin 3 is made of a thermosetting epoxy resin obtained by dispersing silica having a particle diameter of about 70 to 100 μm.

Figure 19:
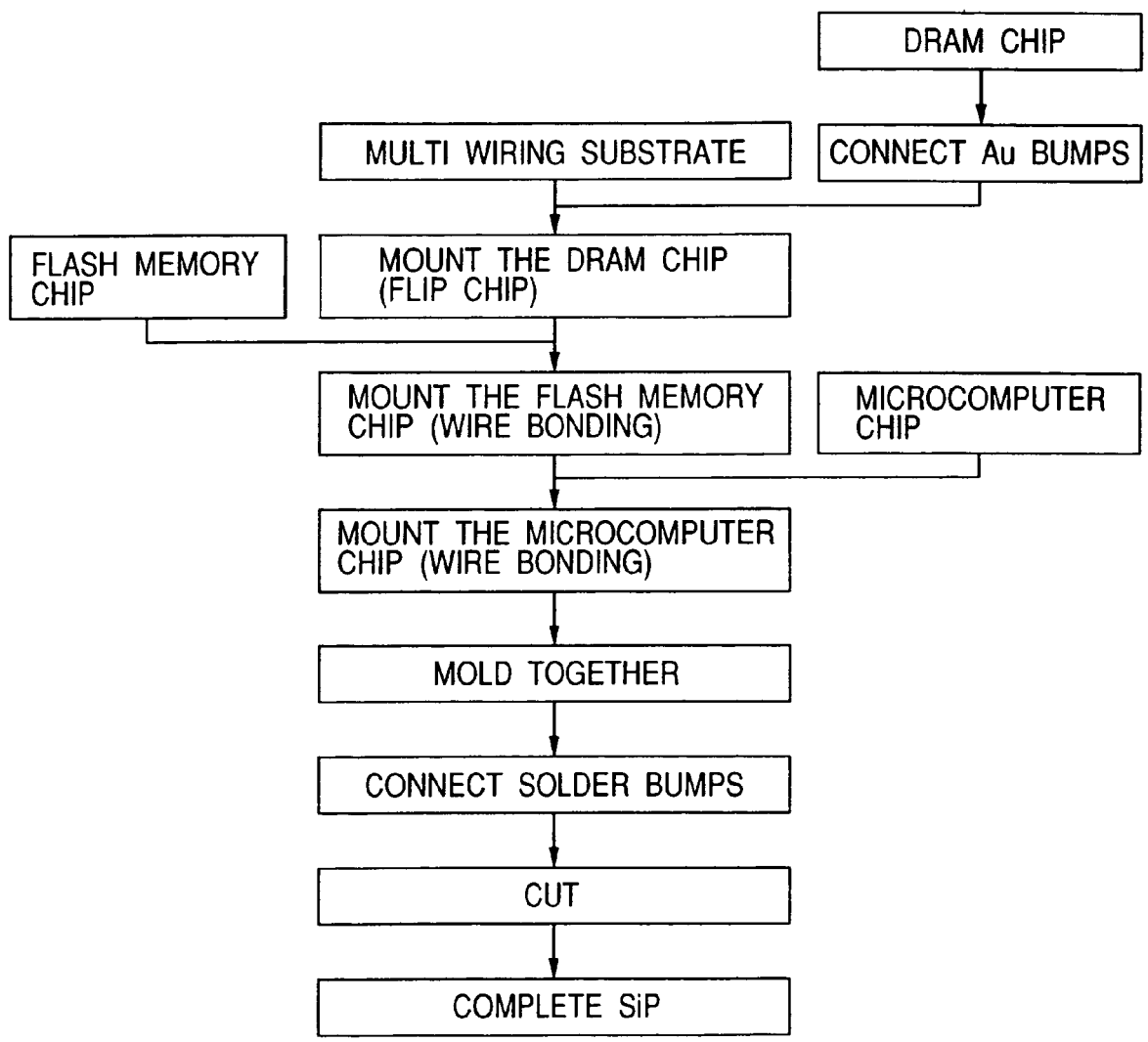
FIG. 19 is an overall flowchart showing a semiconductor device fabrication process of an embodiment of the present invention.

The electrodes 12 of the rear surface of the multi wiring substrate 100 are connected to the solder bumps 13. Subsequently, the multi wiring substrate 100 is cut along the dicing lines L shown in FIGS. 10 and 11 to be separated into the wiring substrates 1, thereby completing the System in Package (SiP) of this embodiment shown in FIGS. 1 to 4. Connection of the solder bumps 13 is done by supplying solder balls made of a Pb—Sn eutectic alloy having a low melting point to the surface of the electrodes 12 to reflow the solder balls. FIG. 19 is an overall flowchart of the above-described fabrication process.

Embodiment 2

Figure 20:
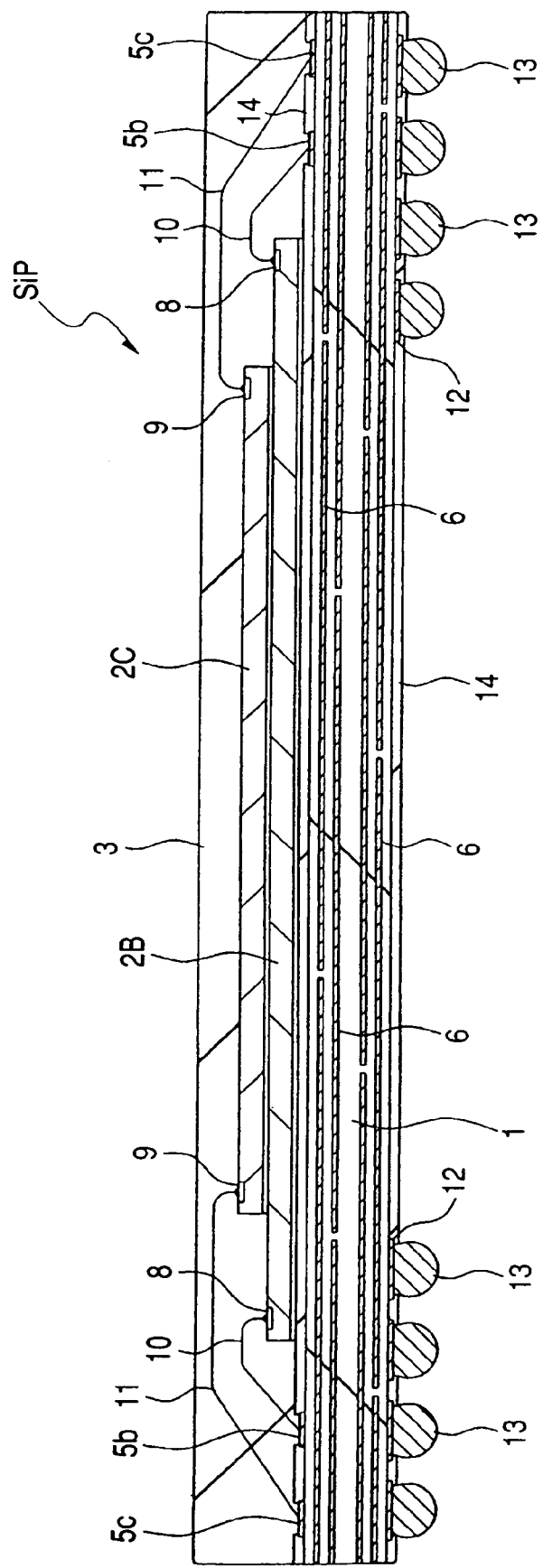
FIG. 20 is a cross-sectional view showing a semiconductor device of another embodiment of the present invention.
Figure 21:
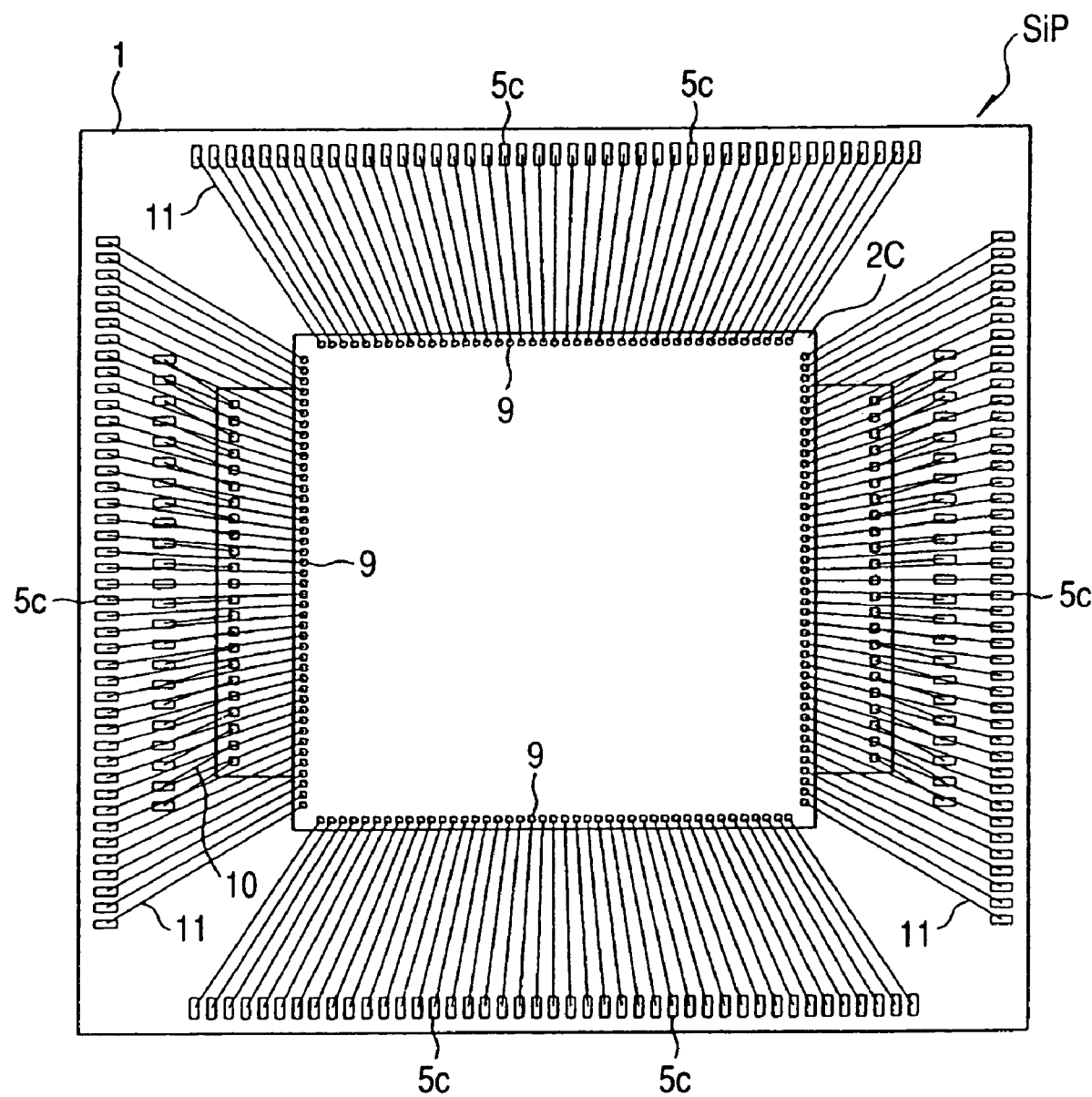
FIG. 21 is a plan view showing the inner structure of a semiconductor device of another embodiment of the present invention.

FIG. 20 is a cross-sectional view showing a semiconductor device of this embodiment. FIG. 21 is a plan view showing the inner structure of the semiconductor device.

The semiconductor device of this embodiment is a System in Package (SiP) having a stack structure such that two silicon chips (a memory chip 2B and a microcomputer chip 2C) are stacked in two stages and mounted over the main surface of a wiring substrate 1 to seal the silicon chips (the memory chip 2B and the microcomputer chip 2C) by a mold resin 3.

The memory chip 2B is a silicon chip formed with a flash memory, as in Embodiment 1. A plurality of bonding pads 8 formed along two short sides of its main surface (upper surface) are connected to electrodes 5b of the wiring substrate 1 via Au wires 10, respectively. In other words, the memory chip 2B is connected to the wiring substrate 1 by the wire bonding method.

The microcomputer chip 2C in the upper stage stacked over the memory chip 2B is a silicon chip formed with a highspeed MPU, as in Embodiment 1. The plurality of bonding pads 8 formed along two short sides of its main surface (upper surface) are connected to the electrodes 5b of the wiring substrate 1 via the Au wires 10, respectively. In other words, the microcomputer chip 2C is stacked over the memory chip 2B to be connected to the wiring substrate 1 by the wire bonding method.

The memory chip 2B formed with the flash memory is constructed so as to transmit and receive data to/from the outside of the system via the microcomputer chip 2C and has a small number of terminals (pins). The microcomputer chip 2C is constructed of a multiport structure having various interfaces between it and the outside of the system in addition to an interface between it and the inside of the system (the memory chip 2B). The number of terminals (pins) of the microcomputer chip 2C is much larger than that of the memory chip 2B.

When the microcomputer chip 2C having a large number of pins is mounted over the wiring substrate 1, the number of electrodes 5c of the wiring substrate 1 connected to the microcomputer chip 2C is larger than that of the electrodes 5b connected to the memory chip 2B. To secure the pitch of the electrodes 5c, the electrodes 5c must be arranged in positions away from the center of the wiring substrate 1. To promote high-density mounting of the System in Package (SiP), the outer dimensions of the wiring substrate 1 must be minimized. The electrodes 5c connected to the microcomputer chip 2C are arranged in the outermost periphery part of the wiring substrate 1. The electrodes 5b connected to the memory chip 2B are arranged in the inside thereof.

When the microcomputer chip 2C having a large number of pins and the memory chip 2B having a small number of pins are stacked and mounted over the wiring substrate 1, the microcomputer chip 2C must be arranged in the upper stage of the memory chip 2B to prevent Au wires 11 connecting the microcomputer chip 2C and the electrodes 5c from being in contact with the Au wires 10 connecting the memory chip 2B and the electrodes 5b.

From such reason, when the two silicon chips (the memory chip 2B and the microcomputer chip 2C) are stacked in two stages and mounted, the memory chip 2B is arranged in the lower stage and the microcomputer chip 2C is arranged in the upper stage to realize the small and high-performance System in Package (SiP) suitable for high-density mounting.

A method for fabricating the System in Package (SiP) of this embodiment is the same as that of Embodiment 1 except that there is no step for mounting a memory chip 2A formed with a DRAM over the wiring substrate 1.

In the above example, the memory chip 2B formed with the flash memory and the microcomputer chip 2C formed with the MPU are mounted over the wiring substrate 1 to construct the System in Package (SiP). The memory chip 2A formed with the DRAM and the microcomputer chip 2C can also be mounted over the wiring substrate 1 to construct the System in Package (SiP).

Also in this case, when the memory chip 2A is constructed so as to transmit and receive data to/from the outside of the system via the microcomputer chip 2C and the microcomputer chip 2C is constructed of a multiport structure having various interfaces between it and the outside of the system in addition to an interface between it and the inside of the system, the number of pins of the microcomputer chip 2C is larger than that of the memory chip 2A. From the above reason, the memory chip 2A is arranged in the lower stage and the microcomputer chip 2C is arranged in the upper stage to realize the small and high-performance System in Package (SiP) suitable for high-density mounting. A method for fabricating the System in Package (SiP) is the same as that of Embodiment 1 except that there is no step for mounting the memory chip 2B formed with the flash memory over the wiring substrate 1.

Embodiment 3

Figure 22:
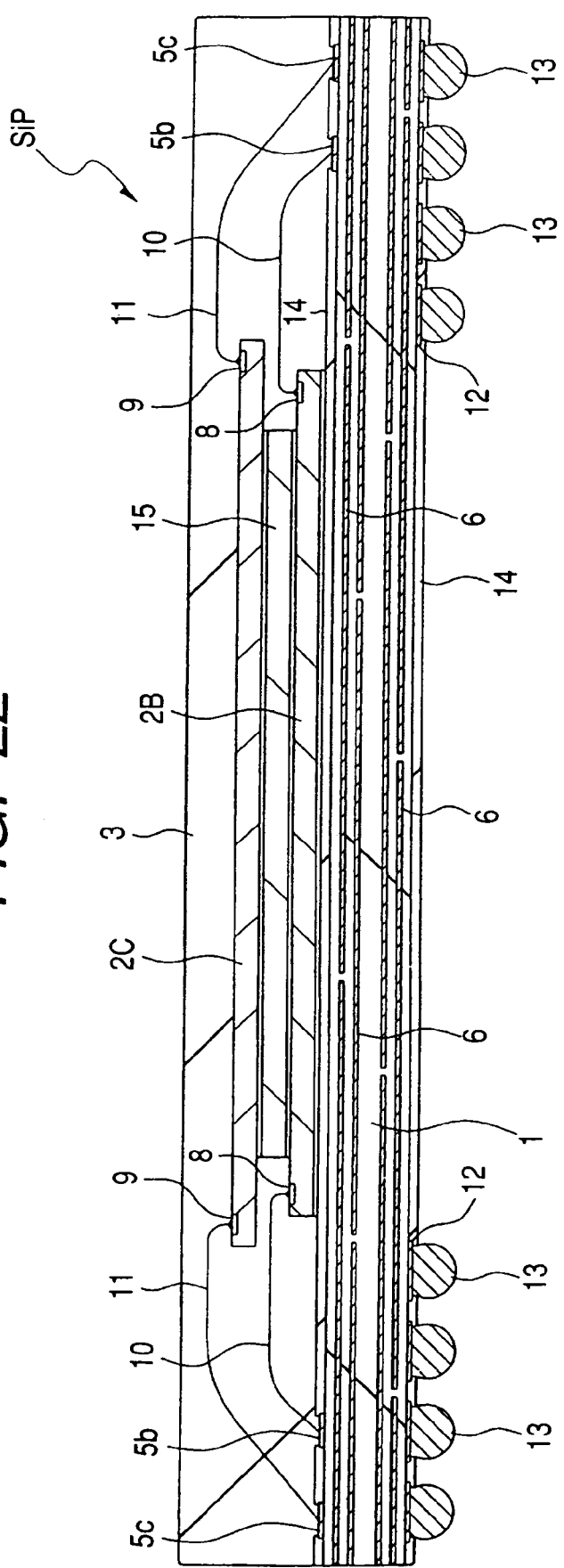
FIG. 22 is a cross-sectional view showing a semiconductor device of a further embodiment of the present invention.

FIG. 22 is a cross-sectional view showing a semiconductor device of this embodiment. As in Embodiment 2, the semiconductor device is a System in Package (SiP) having a stack structure such that two silicon chips (a memory chip 2B and a microcomputer chip 2C) are stacked in two stages and mounted over the main surface of a wiring substrate 1 to seal the silicon chips (the memory chip 2B and the microcomputer chip 2C) by a mold resin 3.

The System in Package (SiP) of this embodiment is the same as the System in Package (SiP) of Embodiment 2 except that the outer dimensions of the microcomputer chip 2C are larger than those of the memory chip 2 and a spacer 15 is interposed between the microcomputer chip 2C and the memory chip 2B.

The memory chip 2B is a silicon chip formed with a flash memory. A plurality of bonding pads 8 formed along two short sides of its main surface (upper surface) are connected to electrodes 5b of the wiring substrate 1 via Au wires 10, respectively. The microcomputer chip 2C in the upper stage stacked over the memory chip 2B via the spacer 15 is a silicon chip formed with a high-speed MPU. A plurality of bonding pads 9 formed along four sides of its main surface (upper surface) are connected to electrodes 5c of the wiring substrate 1 via Au wires 11, respectively.

As in Embodiment 2, the memory chip 2B formed with the flash memory is constructed so as to transmit and receive data to/from the outside of the system via the microcomputer chip 2C and has a small number of terminals (pins). The microcomputer chip 2C is constructed of a multiport structure having various interfaces between it and the outside of the system in addition to an interface between it and the inside of the system (the memory chip 2B). The number of terminals (pins) of the microcomputer chip 2C is much larger than that of the memory chip 2B.

Also in this embodiment, the memory chip 2B having a small number of pins is arranged in the lower stage and the microcomputer chip 2C having a large number of pins is arranged in the upper stage to realize the small and high-performance System in Package (SiP) suitable for high-density mounting.

Figure 23:
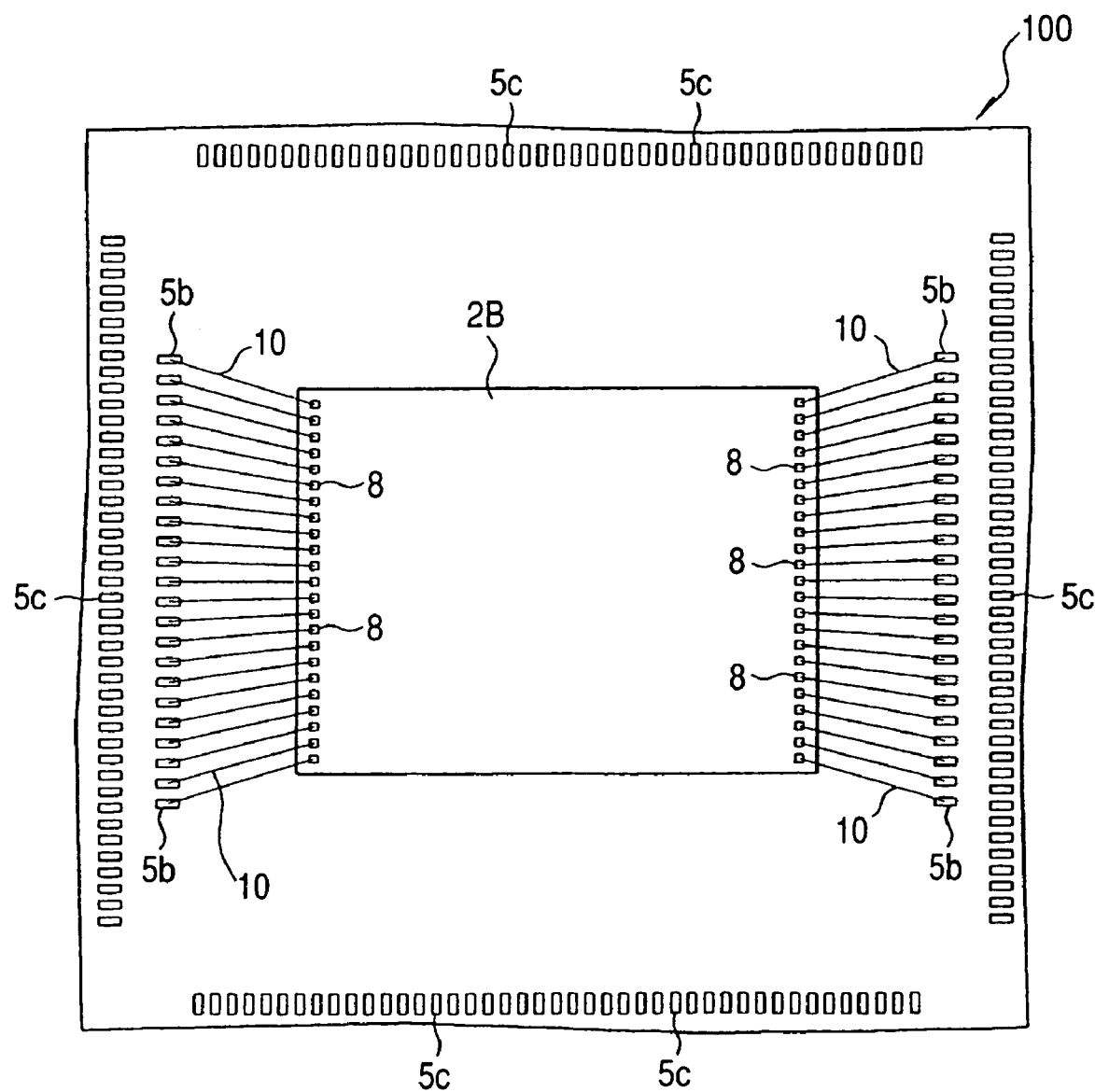
FIG. 23 is a plan view of an essential part of a multi wiring substrate showing a semiconductor device fabrication method of a further embodiment of the present invention.
Figure 24:
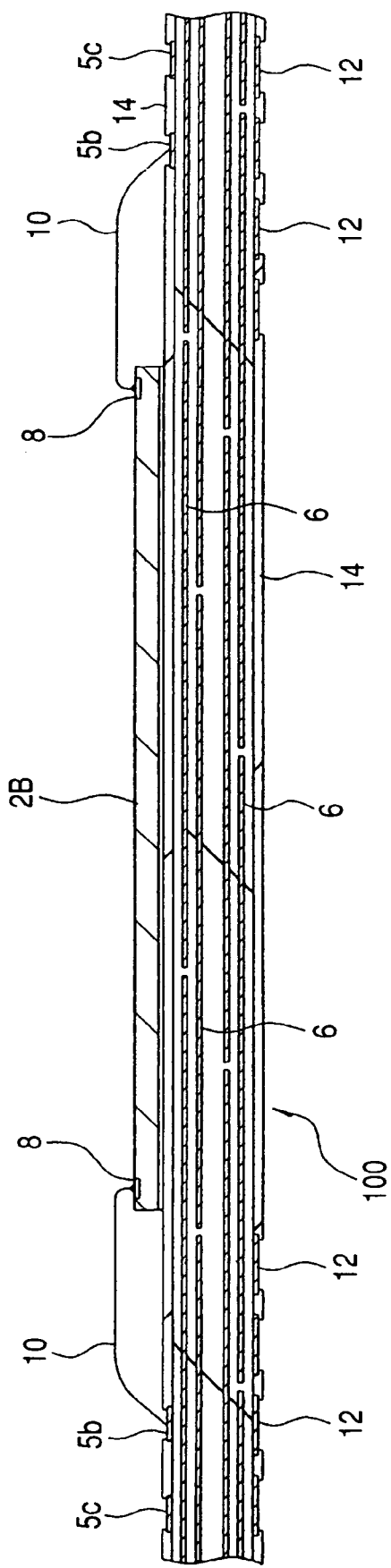
FIG. 24 is a cross-sectional view of an essential part of a multi wiring substrate showing a semiconductor device fabrication method of a further embodiment of the present invention.

To fabricate the System in Package (SiP) of this embodiment, as shown in FIGS. 23 and 24, after fixing the memory chip 2B over each of wiring substrate areas of the main surface of a multi wiring substrate 100 using an adhesive, the bonding pads 8 of the memory chip 2B and the electrodes 5b of the multi wiring substrate 100 are connected by the Au wires 10.

Figure 25:
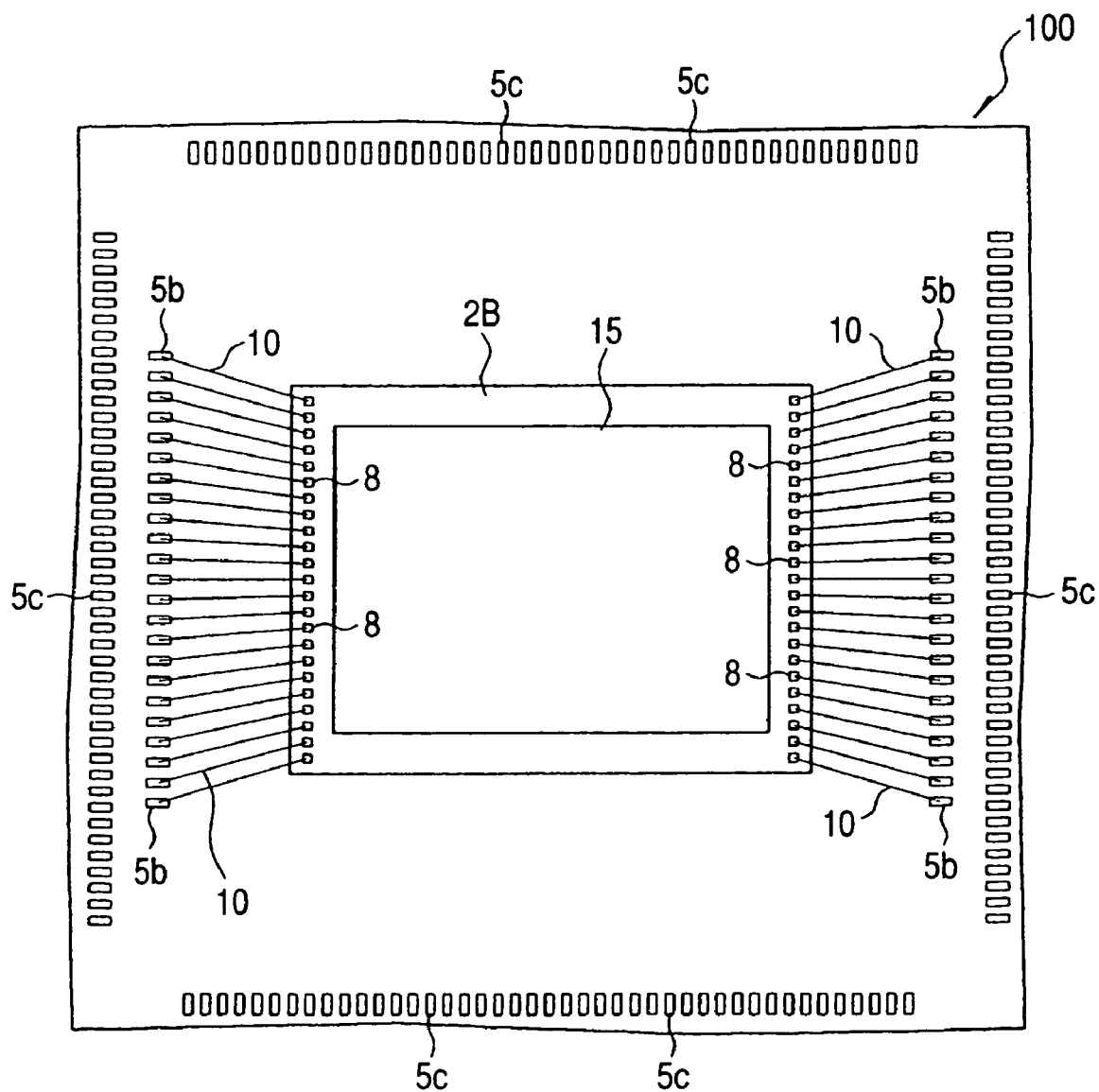
FIG. 25 is a plan view of an essential part of a multi wiring substrate showing a semiconductor device fabrication method of a further embodiment of the present invention.
Figure 26:
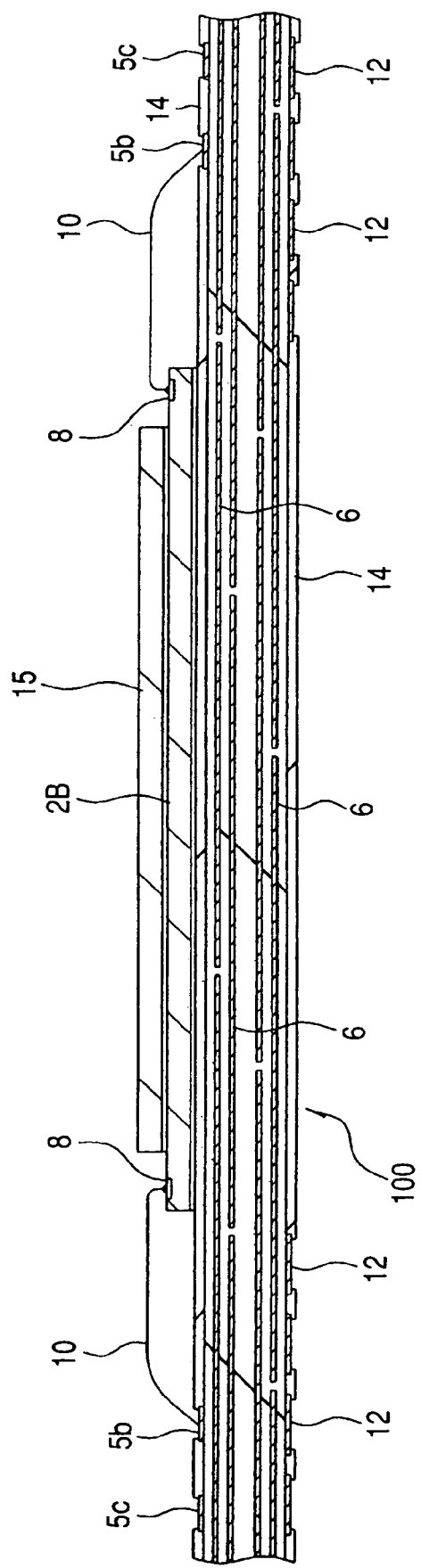
FIG. 26 is a cross-sectional view of an essential part of a multi wiring substrate showing a semiconductor device fabrication method of a further embodiment of the present invention.

As shown in FIGS. 25 and 26, the spacer 15 is fixed over the upper surface of the memory chip 2B using an adhesive. The spacer 15 consists of a silicon chip not formed with a device and has outer dimensions not covering the bonding pads 8 of the memory chip 2B when fixed over the upper surface of the memory chip 2B. The spacer 15 also has a thickness so that when fixed over the upper surface of the memory chip 2B, its upper surface is higher than the loop height of the Au wires 10.

Figure 27:
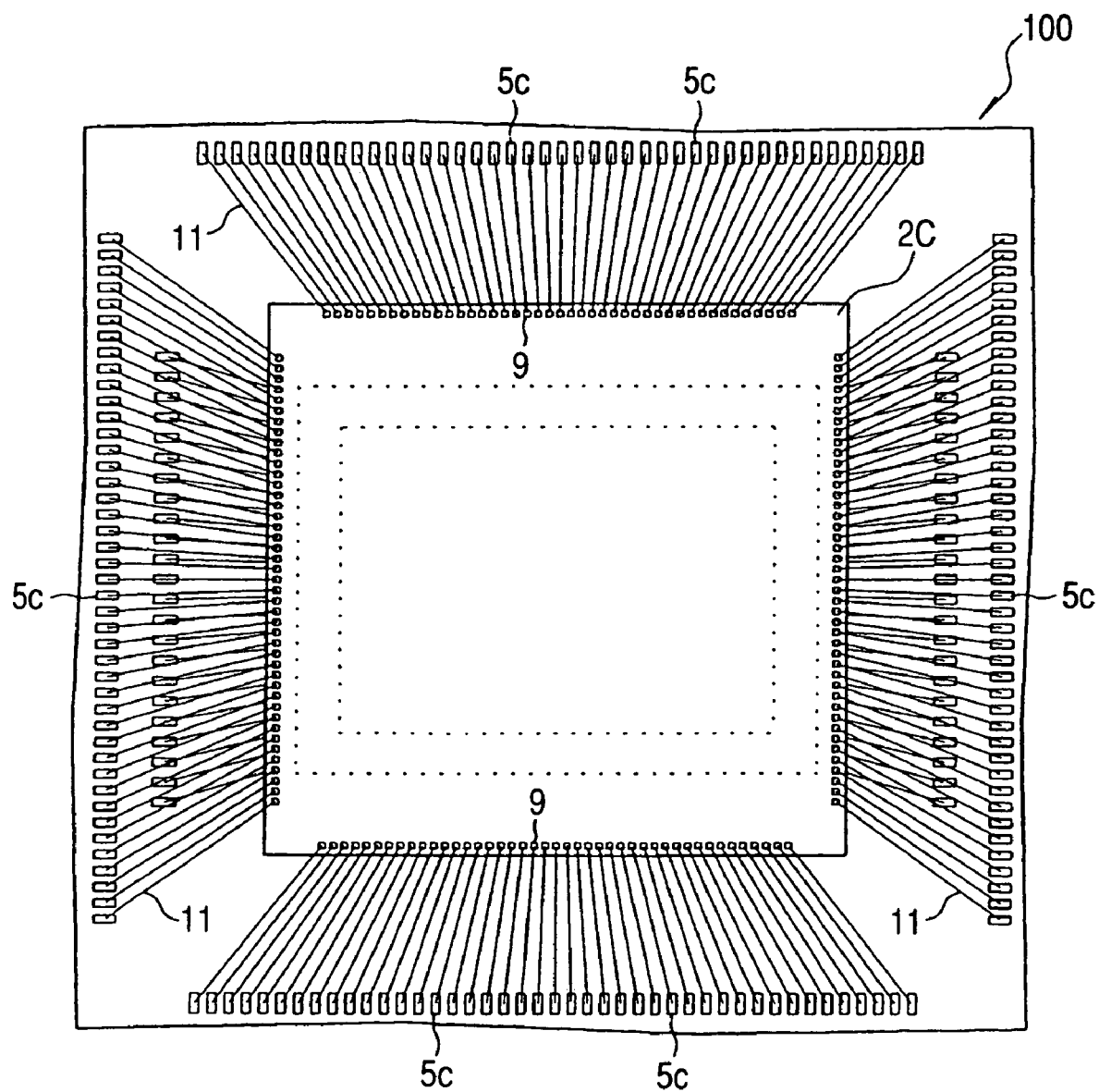
FIG. 27 is a plan view of an essential part of a multi wiring substrate showing a semiconductor device fabrication method of a further embodiment of the present invention.
Figure 28:
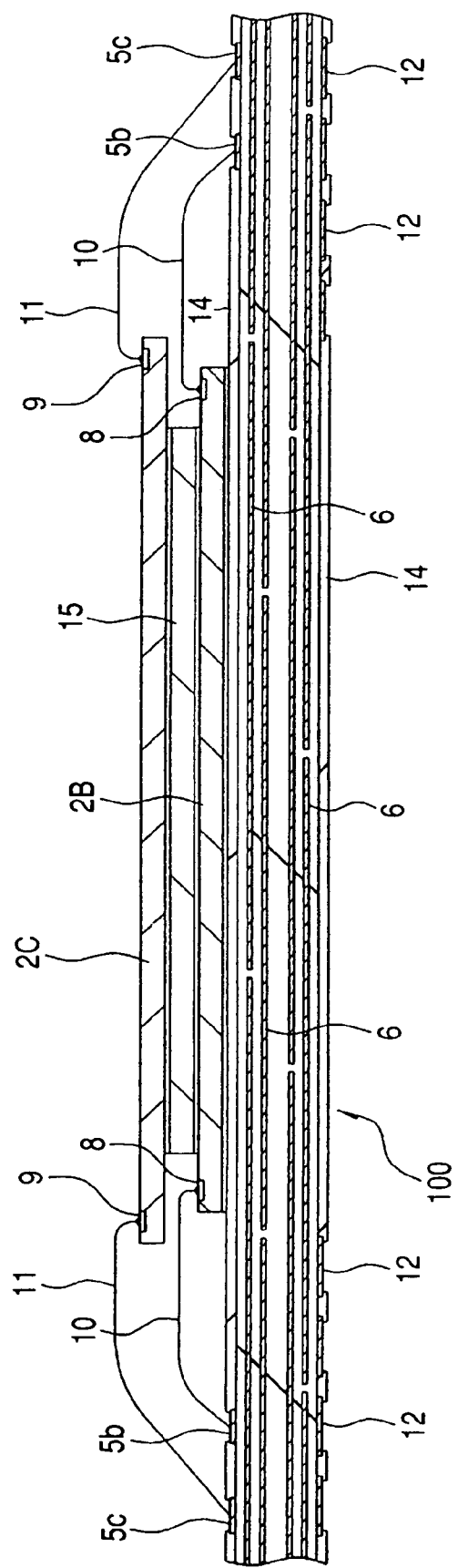
FIG. 28 is a cross-sectional view of an essential part of a multi wiring substrate showing a semiconductor device fabrication method of a further embodiment of the present invention.

As shown in FIGS. 27 and 28, after fixing the microcomputer chip 2C over the upper surface of the spacer 15 using an adhesive, the bonding pads 9 of the microcomputer chip 2C and the electrodes 5c of the multi wiring substrate 100 are connected by the Au wires 11.

As in the fabrication method of Embodiment 1, the entire main surface of the multi wiring substrate 100 is sealed by the mold resin 3. Subsequently, electrodes 12 of the rear surface of the multi wiring substrate 100 are connected to solder bumps 13. The multi wiring substrate 100 is cut to be separated into the wiring substrates 1, thereby completing the System in Package (SiP) of this embodiment shown in FIG. 22.

In the above example, the memory chip 2B formed with the flash memory and the microcomputer chip 2C formed with the MPU are mounted over the wiring substrate 1 to construct the System in Package (SiP). A memory chip 2A formed with a DRAM and the microcomputer chip 2C having outer dimensions larger than those of the memory chip 2A can also be mounted over the wiring substrate 1 to construct the System in Package (SiP).

When the microcomputer chip 2C having a large number of pins and the memory chip 2B (or 2A) having a small number of pins are stacked in two stages and mounted, the memory chip 2B (or 2A) is arranged in the lower stage and the microcomputer chip 2C is arranged in the upper stage irrespective of the size of the relative outer dimensions of the microcomputer chip 2C and the memory chip 2B (or 2A) to realize the small and high-performance System in Package (SiP) suitable for high-density mounting.

The inventions which have been made by the present inventors are specifically described above based on the above embodiments. The present invention is not limited to the above embodiments and various modifications can be made within the scope without departing from its purpose.

For example, a microcomputer chip can be stacked over a memory chip formed with an SRAM to construct a System in Package (SiP).

In addition, small electronic parts other than chips such as a capacitor or a resistance device in addition to a memory chip and a microcomputer chip can be mounted over a wiring substrate. For example, a chip capacitor is mounted along the outer periphery of the memory chip to reduce noise caused when driving the memory chip for realizing high-speed operation. Further, a buildup substrate can be used as a wiring substrate mounting chips and other small electronic parts.

A brief description of the effect obtained by the representative inventions disclosed in the present invention will be given as follows.

When the microcomputer chip having a large number of pins and the memory chip having a small number of pins are stacked and mounted over the wiring substrate, the memory chip is arranged in the lower stage and the microcomputer chip is arranged in the upper stage, thereby realizing the small and high-performance System in Package (SiP) suitable for high-density mounting.

What is claimed is:

1. A semiconductor device comprising:
    a wiring substrate having a plurality of first electrodes and a plurality of second electrodes;
    a memory chip having a plurality of first bonding pads, and mounted over an upper surface of the wiring substrate;
    a microcomputer chip having a plurality of second bonding pads, and mounted over an upper surface of the memory chip;
    a plurality of first wires electrically connecting the plurality of first electrodes with the plurality of first bonding pads;
    a plurality of second wires electrically connecting the plurality of second electrodes with the plurality of second bonding pads; and
    a mold resin sealing the plurality of first electrodes, the plurality of second electrodes, the memory chip, the microcomputer chip, the plurality of first wires, and the plurality of second wires;
    wherein a number of the plurality of second electrodes is more than a number of the plurality of first electrodes;
    wherein the plurality of second electrodes are arranged more toward a periphery of the wiring substrate than the plurality of first electrodes; and
    wherein a number of the plurality of second bonding pads is more than a number of the plurality of first bonding pads.

2. The semiconductor device according to claim 1, wherein a system is comprised of the microcomputer chip and the memory chip.

3. The semiconductor device according to claim 2, wherein the microcomputer chip has a multiport structure including an interface to the memory chip, and an interface to the outside of the system; and
    wherein the memory chip is accessible from the outside of the system via the microcomputer chip.

4. The semiconductor device according to claim 1, wherein the memory chip is formed with a DRAM or a flash memory.

5. The semiconductor device according to claim 1, wherein the microcomputer chip has a plurality of sides;
    wherein the memory chip has a first side and a second side, the first side and the second side are transverse to each other, the second side is longer than the first side;
    wherein each of the plurality of sides of the microcomputer chip is longer than the first side of the memory chip; and
    wherein each of the plurality of sides of the microcomputer chip is shorter than the second side of the memory chip.

* * * * *